United States Patent
Kim et al.

(10) Patent No.: US 12,108,619 B2
(45) Date of Patent: Oct. 1, 2024

(54) LIGHT EMITTING DISPLAY PANEL AND LIGHT EMITTING DISPLAY APPARATUS INCLUDING THE SAME

(71) Applicant: LG Display Co., Ltd., Seoul (KR)

(72) Inventors: Seungkyeom Kim, Paju-si (KR); Jongsung Kim, Paju-si (KR); Hyesook Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 435 days.

(21) Appl. No.: 17/511,282

(22) Filed: Oct. 26, 2021

(65) Prior Publication Data
US 2022/0131104 A1 Apr. 28, 2022

(30) Foreign Application Priority Data
Oct. 27, 2020 (KR) .......................... 10-2020-0140505

(51) Int. Cl.
| | |
|---|---|
| *H10K 59/122* | (2023.01) |
| *H10K 50/822* | (2023.01) |
| *H10K 59/123* | (2023.01) |
| *H10K 59/124* | (2023.01) |
| *H10K 59/131* | (2023.01) |
| *H10K 71/00* | (2023.01) |
| *H10K 59/12* | (2023.01) |

(52) U.S. Cl.
CPC .......... *H10K 50/822* (2023.02); *H10K 59/122* (2023.02); *H10K 59/123* (2023.02); *H10K 59/124* (2023.02); *H10K 59/131* (2023.02); *H10K 71/00* (2023.02); *H10K 59/1201* (2023.02)

(58) Field of Classification Search
CPC .... H10K 59/8052–80522; H10K 50/822–822; H10K 59/122; H10K 59/124
See application file for complete search history.

(56) References Cited

U.S. PATENT DOCUMENTS

| | | | |
|---|---|---|---|
| 2018/0006094 A1* | 1/2018 | Hayashi | ................ G06F 3/0446 |
| 2019/0103450 A1* | 4/2019 | Heo | ...................... H10K 50/81 |
| 2019/0115403 A1 | 4/2019 | Kang | |
| 2021/0234125 A1* | 7/2021 | Sung | .................... H10K 50/844 |

FOREIGN PATENT DOCUMENTS

| | | |
|---|---|---|
| KR | 10-2017-0015637 A | 2/2017 |
| KR | 10-2017-0015829 A | 2/2017 |
| KR | 10-1948898 B1 | 2/2019 |
| KR | 10-2019-0042395 A | 4/2019 |

* cited by examiner

*Primary Examiner* — Evan G Clinton
(74) *Attorney, Agent, or Firm* — Birch, Stewart, Kolasch & Birch, LLP

(57) ABSTRACT

A light emitting display panel can include a first pixel and a second pixel disposed adjacent to each other on a planarization layer; an anode disposed in each of the first and second pixels; a light emitting layer disposed in each the first and second pixels; a main cathode disposed in each of the first and second pixels; a boundary groove in the planarization layer in an area between the first and second pixels; a boundary region cathode disposed in the boundary groove, in which the boundary region cathode and the main cathode are spaced apart from each other in the boundary groove, and the boundary region cathode and the main cathode are electrically connected to each other in a region outside of the boundary groove.

20 Claims, 12 Drawing Sheets

(a)　　　　　　　　　　　　(b)

(a)　　　　　　　　　　　　(b)

(a)　　　　　　　　　　　　(b)

(a)　　　　　　　　　　　　(b)

(a)    (b)

(a)    (b)

(a)    (b)

(a)     (b)

(a)     (b)

(a)   (b)

(a)   (b)

LIGHT EMITTING DISPLAY PANEL AND LIGHT EMITTING DISPLAY APPARATUS INCLUDING THE SAME

CROSS-REFERENCE TO RELATED APPLICATIONS

This application claims priority to Korean Patent Application No. 10-2020-0140505 filed in the Republic of Korea on Oct. 27, 2020, the entire contents of which are hereby incorporated by reference as if fully set forth herein into the present application.

BACKGROUND

Field of the Invention

The present disclosure relates to a light emitting display panel and a light emitting display apparatus including the same.

Discussion of the Related Art

Light emitting display apparatuses are display apparatuses which output light by using a light emitting device and include a light emitting display panel including a plurality of light emitting devices.

As a resolution of the light emitting display panel increases progressively, undesired light is emitted due to a lateral leakage current (LLC) between adjacent pixels.

Emitting of light caused by the LLC between adjacent pixels occurs due to a light emitting layer and a cathode, which are continuously included in adjacent pixels.

For example, as ultra-high definition display panels density pack more sub-pixels closer together, potential current leakage between adjacent sub-pixels and unwanted color mixing can become more of an issue.

SUMMARY OF THE DISCLOSURE

The present disclosure is directed to providing a light emitting display panel and a light emitting display apparatus including the same that substantially obviate one or more problems due to limitations and disadvantages of the related art.

An aspect of the present disclosure is directed to providing a light emitting display panel and a light emitting display apparatus including the same, in which a boundary region cathode provided in a boundary region between two adjacent pixels is spaced apart from a main cathode covering opening regions of two pixels, in a boundary groove.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light emitting display panel that includes a substrate including a non-display area and a display area where a plurality of pixels are provided, a pixel driving circuit layer provided in the substrate, the pixel driving circuit layer including a driving transistor, a planarization layer covering the pixel driving circuit layer, a plurality of anodes provided on the planarization layer, each of the plurality of anodes configuring a pixel, a bank including a plurality of opening regions at which the plurality of anodes are exposed, a light emitting layer provided on the plurality of anodes and the bank, and a cathode provided on the light emitting layer and in the whole display area of the substrate. A boundary region is provided at an outer portion of each of the plurality of anodes, the cathode includes a boundary region cathode and a main cathode, the boundary region cathode is provided in a boundary groove provided in the boundary region, the main cathode is provided at a portion, except the boundary groove, of the display area, and the boundary region cathode and the main cathode are apart from each other in the boundary groove.

According to the embodiments of the present disclosure, an LLC between adjacent pixels is decreased, and thus, light leakage occurring in adjacent pixels can be prevented.

Moreover, according to the embodiments of the present disclosure, an optically mixed color may be improved by an undercut structure formed at a boundary groove, and the degree of freedom in developing a high resolution and high color reproduction rate model may increase.

It is to be understood that both the foregoing general description and the following detailed description of the present disclosure are examples and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION OF THE EMBODIMENTS

Figure 1:
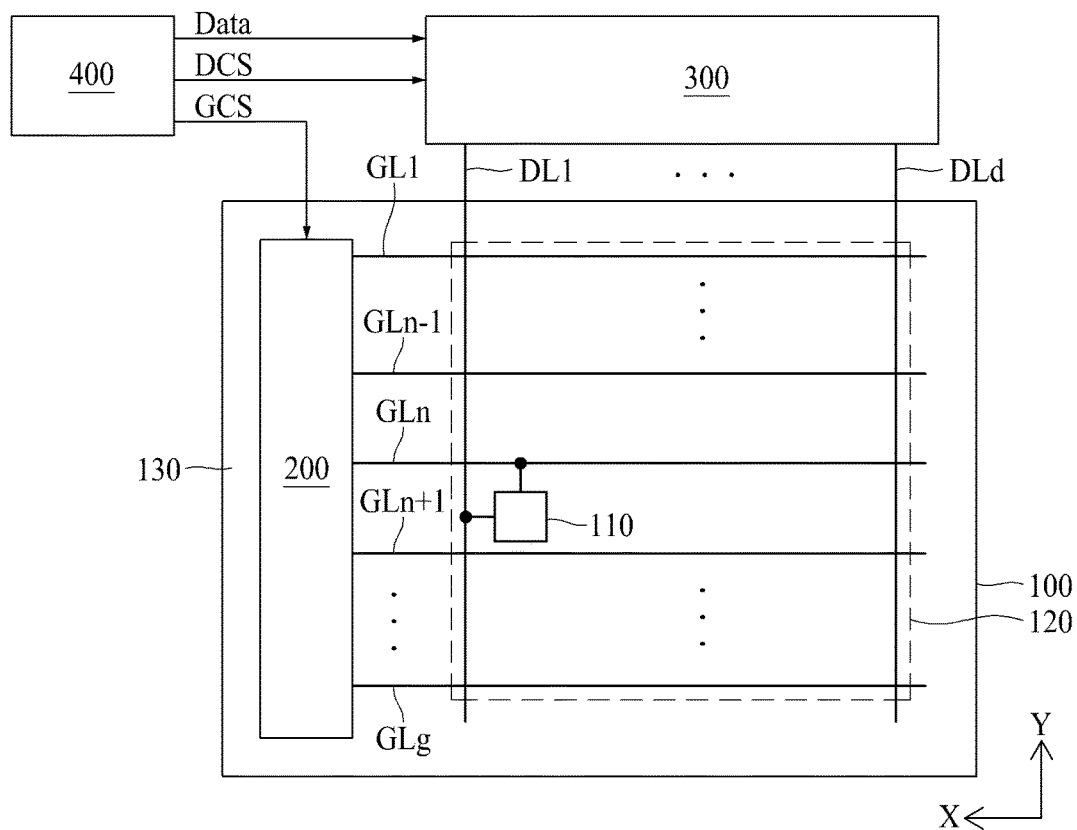
FIG. 1 is a diagram illustrating a configuration of a light emitting display apparatus according to an embodiment of the present disclosure.

Reference will now be made in detail to example embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of the claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a situation that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc. may be used. These terms are intended to identify the corresponding elements from the other elements, and basis, order, or number of the corresponding elements should not be limited by these terms. The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Hereinafter, embodiments of the present disclosure will be described in detail with reference to the accompanying drawings. For convenience of description, a scale of each of elements illustrated in the accompanying drawings may differ from a real scale, and thus, is not limited to a scale illustrated in the drawings.

Figure 2:
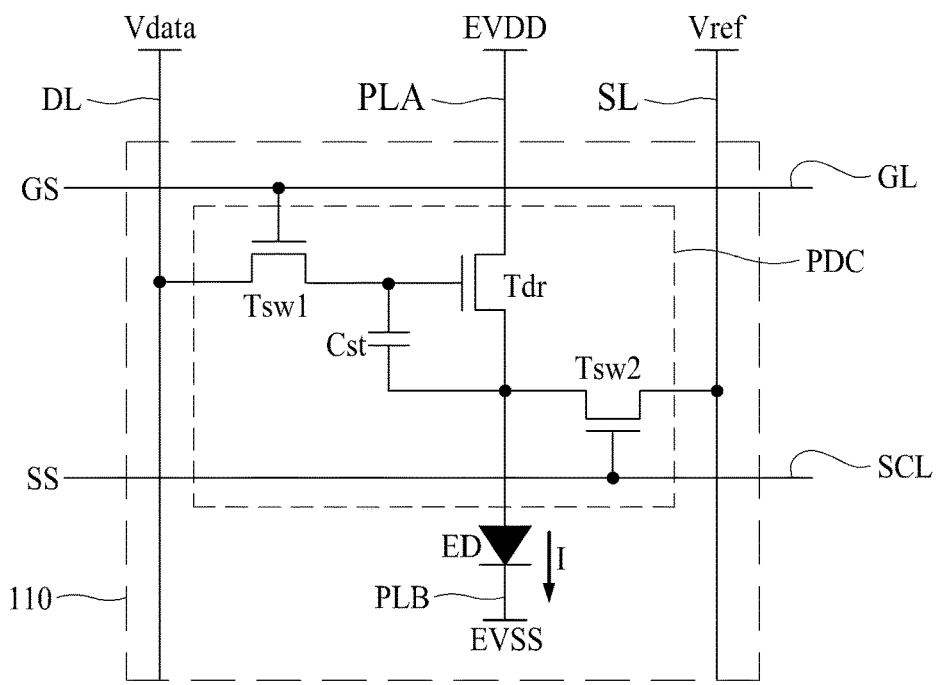
FIG. 2 is a diagram illustrating a structure of a pixel applied to a light emitting display apparatus according to an embodiment of the present disclosure.

FIG. 1 is a diagram illustrating a configuration of a light emitting display apparatus according to the present disclosure, and FIG. 2 is a diagram illustrating a structure of a pixel applied to a light emitting display apparatus according to the present disclosure.

The light emitting display apparatus according to the present disclosure can configure various kinds of electronic devices. The electronic devices can include, for example, smartphones, tablet personal computers (PCs), televisions (TVs), and monitors.

The light emitting display apparatus according to the present disclosure, as illustrated in FIG. 1, can include a light emitting display panel 100 which includes a display area 120 displaying an image and a non-display area 130 provided outside the display area 120, a gate driver 200 which supplies a gate signal to a plurality of gate lines GL1 to GLg provided in the display area 120 of the light emitting display panel 100, a data driver 300 which supplies data voltages to a plurality of data lines DL1 to DLd provided in the light emitting display panel 100, and a controller 400 which controls driving of the gate driver 200 and the data driver 300. Here, g can be a natural number, and d can be a natural number (e.g., positive integers greater than zero).

First, the light emitting display panel 100 can include the display area 120 and the non-display area 130. The gate lines GL1 to GLg, the data lines DL1 to DLd, and a plurality of pixels 110 can be provided in the display area 120.

For example, as illustrated in FIG. 2, the pixel 110 included in the light emitting display panel 100 can include a light emitting device ED, a switching transistor Tsw1, a storage capacitor Cst, a driving transistor Tdr, and a sensing transistor Tsw2. That is, the pixel 110 can include a pixel driving circuit PDC and a light emitting unit, and the pixel driving circuit PDC can include the switching transistor Tsw1, the storage capacitor Cst, the driving transistor Tdr, and the sensing transistor Tsw2. The light emitting unit can include the light emitting device ED.

The brightness of light can be controlled based on a level of a current I flowing in the light emitting device ED, the level of the current I flowing in the light emitting device ED can be controlled by the driving transistor Tdr, and the driving transistor Tdr can be controlled by a data voltage Vdata.

The light emitting device ED can include one of an organic light emitting layer, an inorganic light emitting layer, and a quantum dot light emitting layer, or can include a stack or combination structure of an organic light emitting layer (or an inorganic light emitting layer) and a quantum dot light emitting layer.

Moreover, the light emitting device ED can emit light corresponding to one of various colors such as red, green, and blue, or can emit white light.

The switching transistor Tsw1 configuring the pixel driving circuit PDC can be turned on or off by a gate signal GS supplied through a gate line GL, and when the switching transistor Tsw1 is turned on, the data voltage Vdata supplied through a data line DL can be supplied to the driving transistor Tdr. A first voltage EVDD can be supplied to the driving transistor Tdr and the light emitting device ED through a first voltage supply line PLA, and a second voltage EVSS can be supplied to the light emitting device ED through a second voltage supply line PLB. The sensing transistor Tsw2 can be turned on or off by a sensing control signal SS supplied through a sensing control line SCL, and a sensing line SL can be connected to the sensing transistor Tsw2. A reference voltage Vref can be supplied to the pixel 110 through the sensing line SL, and a sensing signal associated with a characteristic variation of the driving transistor Tdr can be transferred to the sensing line SL through the sensing transistor Tsw2.

The pixel 110 applied to the present disclosure can be formed in a structure as illustrated in FIG. 2, but the present disclosure is not limited thereto. Accordingly, the pixel 110 applied to the present disclosure can be changed to various forms, in addition to a structure illustrated in FIG. 2.

A plurality of pixel areas including the pixels 110 can be provided in the light emitting display panel 100, and signal lines for supplying various signals to the pixel driving circuit PDC can be provided.

For example, in the light emitting display panel including the pixel 110 as illustrated in FIG. 2, the signal lines can include the gate line GL, the data line DL, the sensing control line SCL, the first voltage supply line PLA, the second voltage supply line PLB, and the sensing line SL.

The data driver 300 can be provided in a chip-on film attached on the light emitting display panel 100, and moreover, can be connected to a main substrate including the controller 400. In this situation, lines electrically connecting the controller 400, the data driver 300, and the light emitting display panel 100 can be provided in the chip-on film, and to this end, the lines can be electrically connected to pads included in the light emitting display panel 100 and the main substrate. The main substrate can be electrically connected to an external substrate with an external system mounted thereon.

The data driver 300 can be directly mounted on the light emitting display panel 100, and then, can be electrically connected to the main substrate.

However, the data driver 300 can be implemented as one integrated circuit (IC) along with the controller 400, and the IC can be included in the chip-on film or can be directly mounted on the light emitting display panel 100.

The data driver 300 can receive a sensing signal, associated with a characteristic variation of the driving transistor Tdr included in the light emitting display panel 100, from the light emitting display panel 100 and can transfer the sensing signal to the controller 400.

The gate driver 200 can be configured as an IC, and then, can be provided in the non-display area 130 or can be directly embedded into the non-display area 130 by using a gate-in panel (GIP) type. In a situation where the GIP type is used, transistors configuring the gate driver 200 can be provided in the non-display area 130 through the same process as transistors included in each of the pixels 110 of the display area 120.

When a gate pulse generated by the gate driver 200 is supplied to a gate of the switching transistor Tsw1 included in the pixel 110, the switching transistor Tsw1 can be turned on, and thus, light can be emitted from the pixel. When a gate-off signal is supplied to the switching transistor Tsw1, the switching transistor Tsw1 can be turned off, and thus, light may not be emitted from the pixel. The gate signal GS supplied through the gate line GL can include the gate pulse and the gate-off signal.

The controller 400 can include a data aligner which realigns pieces of input video data transferred from the external system by using a timing synchronization signal transferred from the external system to supply pieces of realigned image data Data to the data driver 300, a control signal generator which generates a gate control signal GCS and a data control signal DCS by using the timing synchronization signal, an input unit which receives the timing synchronization signal and the pieces of input video data transferred from the external system and transfers the input video data and the input video data to the data aligner and the control signal generator, and an output unit which outputs, to the data driver 300 or the gate driver 200, the pieces of image data Data generated by the data aligner and the control signals DCS and GCS generated by the control signal generator.

The controller 400 can further perform a function of analyzing touch sensing signals received through a touch panel embedded into or attached on the light emitting display panel 100 to sense the occurrence or not of a touch and a touch position.

The external system can perform a function of driving the controller 400 and an electronic device. That is, when the electronic device is a smartphone, the external system can receive various sound information, image information, and letter information over a wireless communication network and can transfer the received image information to the controller 400. The image information can include the pieces of input video data.

Hereinafter, a light emitting display panel having a pixel structure illustrated in FIG. 2 among various types of light emitting display panels will be described as an example of the light emitting display panel according to the present disclosure.

Figure 3:
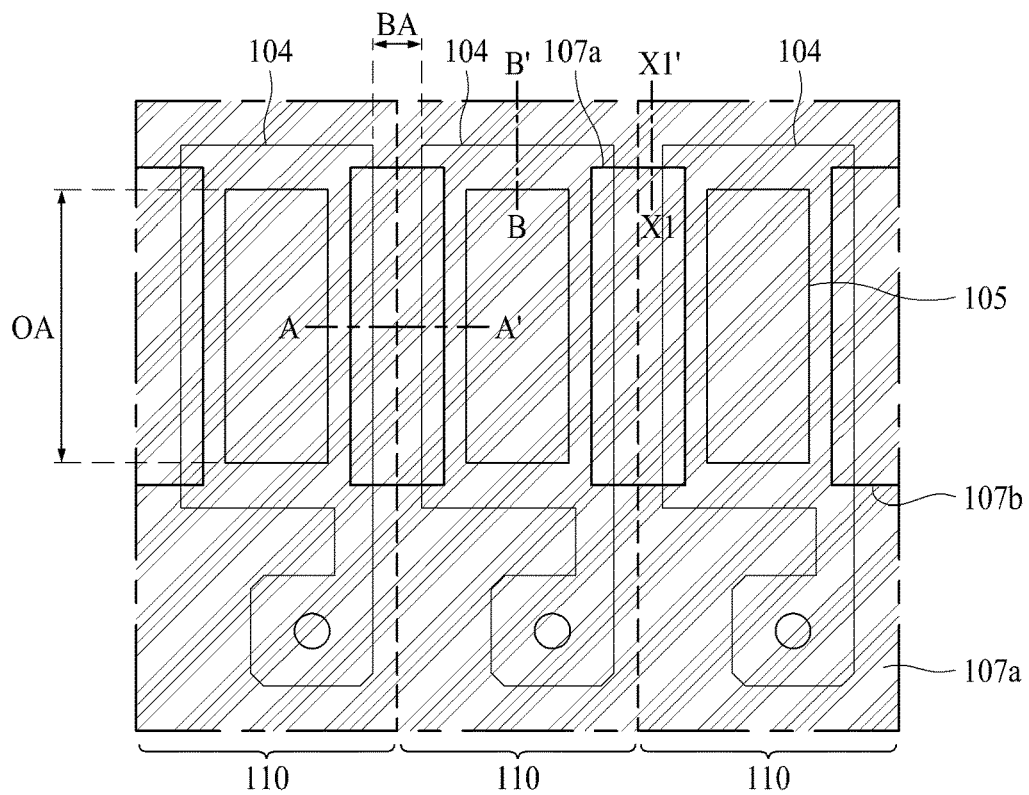
FIG. 3 is a plan view illustrating three pixels included in a light emitting display panel according to an embodiment of the present disclosure.
Figure 4:
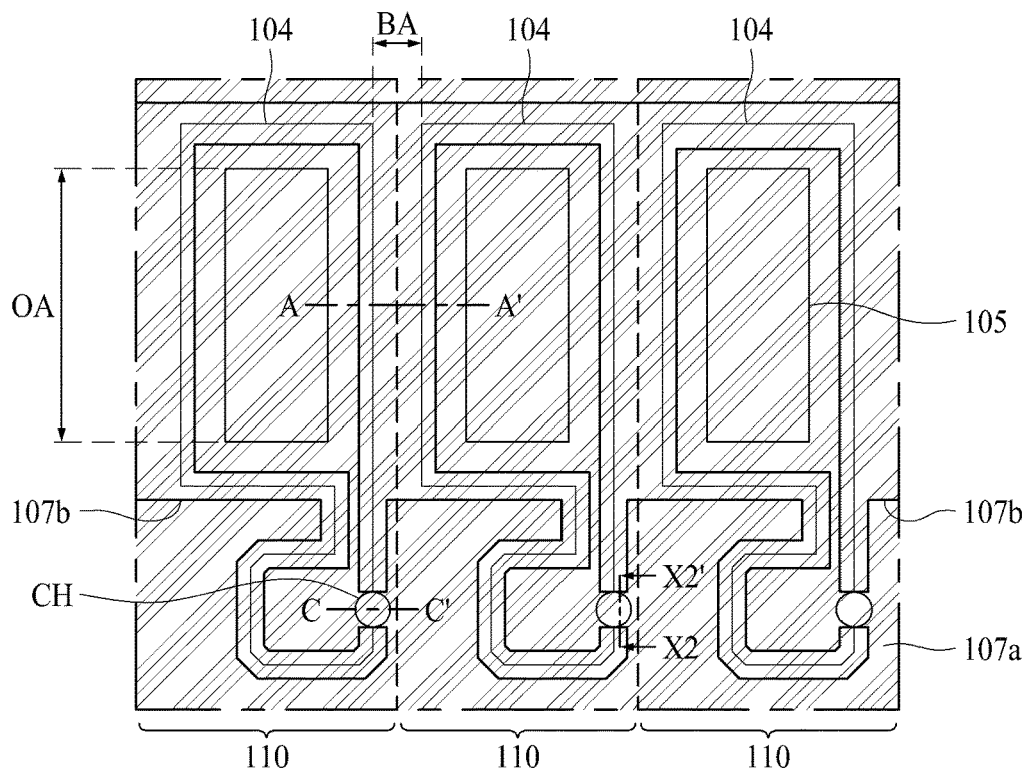
FIG. 4 is another plan view illustrating three pixels included in a light emitting display panel according to an embodiment of the present disclosure.
Figure 5:
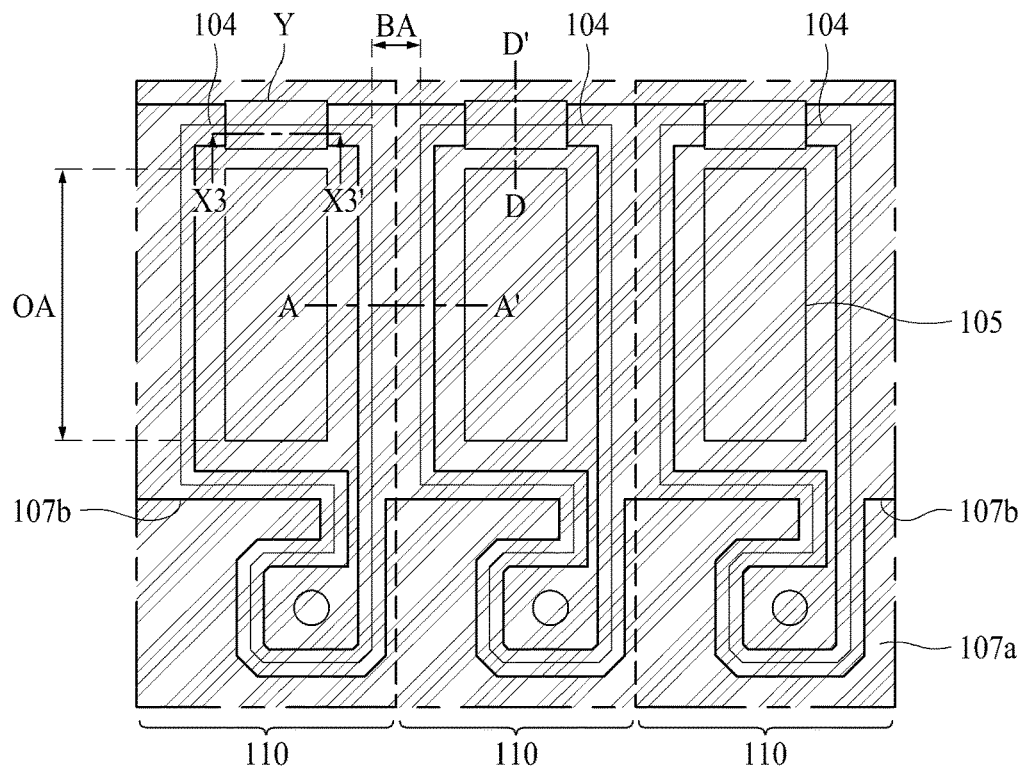
FIG. 5 is another plan view illustrating three pixels included in a light emitting display panel according to an embodiment of the present disclosure.
Figure 6:
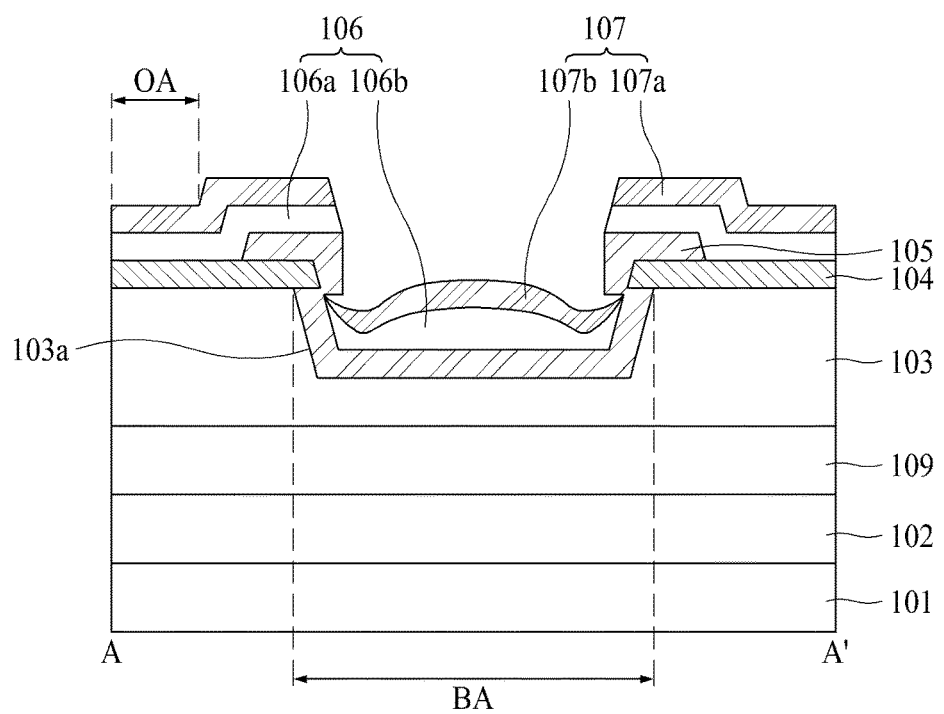
FIG. 6 is a diagram illustrating a cross-sectional surface taken along line A-A' illustrated in FIGS. 3 to 5 according to an embodiment of the present disclosure.

FIG. 3 is a plan view illustrating three pixels (e.g., sub-pixels) included in a light emitting display panel according to the present disclosure, FIG. 4 is another plan view illustrating three pixels included in a light emitting display panel according to the present disclosure, FIG. 5 is another plan view illustrating three pixels included in a light emitting display panel according to the present disclosure, and FIG. 6 is an diagram illustrating a cross-sectional surface taken along line A-A' illustrated in FIGS. 3 to 5. Particularly, three pixels provided along an $n^{th}$ gate line GLn illustrated in FIG. 1 are illustrated in FIGS. 3 to 5, where n can be a positive number such as a positive integer.

The light emitting display panel according to the present disclosure, as illustrated in FIGS. 3 to 6, can include a substrate 101 which includes a non-display area 130 and a display area 120 including a plurality of pixels 110, a pixel driving circuit layer 102 which is provided on the substrate 101 and includes a driving transistor Tdr, a planarization layer 103 which covers the pixel driving circuit layer 102, a plurality of anodes 104 which are provided on the planarization layer 103 and configure the pixels 110, a bank 105 which is provided between the anodes 104, a light emitting layer 106 which is provided on the anodes 104 and the bank 105, and a plate-shaped cathode 107 which is provided on the light emitting layer 106 and is provided in the whole display area 120 of the substrate 101. Here, the cathode 107 can include a boundary region cathode 107b and a main cathode 107a, and a boundary region BA can be provided outside each of the anodes 104. The boundary region cathode 107b can be provided in a boundary groove 103a included in the boundary region BA, and the main cathode 107a can be provided at a portion, other than the boundary groove 103a, of the display area BA. The boundary region cathode 107b can be spaced apart from the main cathode 107a at the boundary groove 103a.

That is, the cathode 107 can include the boundary region cathode 107b, provided in the boundary region BA between two adjacent pixels 110, and the main cathode 107a which is provided in opening regions OA of two adjacent pixels 110.

In the following description, the boundary region BA can denote a region between two adjacent pixels, and particularly, can denote a region between adjacent anodes. Accordingly, a boundary region can be provided at an outer portion of each of the anodes.

The boundary region cathode 107b and the main cathode 107a can be spaced apart from each other in the boundary groove 103a and can be connected to each other at a connection portion provided in the boundary region BA. The substrate 101 can be a glass substrate or a plastic substrate, but is not limited thereto and can include various kinds of films.

The pixel driving circuit layer 102 including the driving transistor Tdr, as illustrated in FIG. 6, can be provided on the substrate 101.

The pixel driving circuit PDC including the driving transistor Tdr can be provided in the pixel driving circuit layer 102. The pixel driving circuit PDC, as described above with reference to FIG. 2, can include a switching transistor Tsw1, a storage capacitor Cst, a driving transistor Tdr, and a sensing transistor Tsw2.

Moreover, the pixel driving circuit layer 102 can include a data line DL, a gate line GL, a sensing control line SCL, a sensing line SL, and a first voltage supply line PLA, which are connected to the pixel driving circuit PDC.

Therefore, the pixel driving circuit layer 102 can include at least two metal layers and at least two insulation layers for insulating the at least two metal layers.

Moreover, the pixel driving circuit layer 102 can further include a buffer which is provided between the driving transistor Tdr and the substrate 101.

Each of the buffer and the insulation layers can include at least one inorganic film or at least one organic film, or can include at least one inorganic film and at least one organic film.

Each of the metal layers can include at least one of various metals, such as copper (Cu) and a molybdenum-titanium (MoTi) alloy.

An insulation layer 109 can be further provided between the pixel driving circuit layer 102 and the planarization layer 103. For example, the insulation layer 109 may not be included in the light emitting display panel 100 illustrated in FIG. 3, and the insulation layer 109 can be further included in the light emitting display panel 100 illustrated in FIGS. 4 and 5.

The planarization layer 103 can be provided on the pixel driving circuit layer 102.

For example, various kinds of transistors and signal lines configuring the pixel driving circuit PDC can be provided in the pixel driving circuit layer 102. In this situation, heights of the various kinds of transistors and signal lines can differ, and a height of a region including the transistors and the signal lines can differ from a height of a region where the transistors and the signal lines are not provided.

Due to such a height difference, a top surface formed by the transistors and the signal lines may not be flat. Accordingly, a top surface of the pixel driving circuit layer 102 may not be flat.

The planarization layer 103 can perform a function of planarizing the top surface, which is not flat, of the pixel driving circuit layer 102. That is, the planarization layer 103 can be formed to have a height which is greater than that of the pixel driving circuit layer 102, and thus, a top surface of the planarization layer 103 can be a flat surface.

The planarization layer 103 can include at least one organic film, or can include at least one inorganic film and at least one organic film.

The anodes 104 can be provided at an upper end of the planarization layer 103 (e.g., anodes 104 can be disposed on an upper surface of the planarization layer 103). The anode 104 can configure the light emitting device ED.

The anode 104 can be electrically connected to the driving transistor Tdr included in the pixel driving circuit layer 102, and as illustrated in FIGS. 3 to 5, each pixel can be patterned.

The anode 104 can include two electrodes configuring the light emitting device ED. For example, when the light emitting device ED is an organic light emitting diode, the organic light emitting diode can include a first pixel electrode, a light emitting layer 106 provided on the first pixel electrode, and a second pixel electrode provided on the light emitting layer 106. The first pixel electrode can be the anode 104, and the second pixel electrode can be the cathode 107. In this situation, the anode 104 can be connected to the driving transistor Tdr.

That is, the anode 104 provided on the planarization layer 103 can be electrically connected to a transistor included in the pixel driving circuit layer 102, and particularly, can be electrically connected to the driving transistor Tdr.

The anode 104 can include a transparent electrode, such as indium tin oxide (ITO) or indium zinc oxide (IZO), or can include an opaque electrode, such as Cu, or can include a transparent electrode and an opaque electrode.

In a situation where the light emitting display panel according to the present disclosure uses a top emission type (e.g., a type where light is irradiated in a direction toward an upper end of the anode 104, the anode 104 can include at least one opaque electrode.

In a situation where the light emitting display panel according to the present disclosure uses a bottom emission type (e.g., a type where light is irradiated in a direction toward a lower end of the anode 104, the anode 104 can include at least one transparent electrode.

The bank 105 can cover outer portions of the anode 104, and thus, can configure an opening region OA where light is output from one pixel 110.

The bank 105, as illustrated in FIGS. 3 to 6, can be formed to surround the outer portions of the anode 104.

That is, the bank 105 can cover ends of the anode 104 and can be provided on a whole surface of the substrate 101 so that the anode 104 is exposed. However, the bank 105 can be formed to have various patterns configuring the opening region OA.

The bank 105 can prevent portions of light from overlapping each other between adjacent pixels (e.g., the bank 105 can help prevent color mixing between adjacent sub-pixels).

The bank 105 can include at least one inorganic film or at least one organic film, or can include at least one inorganic film and at least one organic film.

The light emitting layer 106 can be provided on a whole surface of the substrate 101 to cover the anodes 104 and the bank 105.

The light emitting layer 106 can include one of an organic light emitting layer, an inorganic light emitting layer, and a quantum dot light emitting layer, or can include a stack or combination structure of an organic light emitting layer (or an inorganic light emitting layer) and a quantum dot light emitting layer.

The light emitting layer 106 can include a hole injection layer (HIL), a hole transport layer (HTL), a hole blocking layer (HBL), an electron injection layer (EIL), an electron transport layer (ETL), an electron blocking layer (EBL), and a charge generating layer (CGL).

In a situation where the light emitting layer 106 emits white light, the light emitting layer 106 can include hole injection layer (HIL)/hole transport layer (HTL), a blue organic layer, electron injection layer (EIL)/charge generating layer (CGL)/electron transport layer (ETL), a red organic layer, a yellow green organic layer, electron injection layer (EIL)/charge generating layer (CGL)/electron transport layer (ETL), a blue organic layer, electron injection layer (EIL)/electron transport layer (ETL), and an organic buffer, which are sequentially stacked.

The light emitting layer 106 can be configured with layers having various stack orders, in addition to layers having the above-described stack order.

The light emitting layer 106 can be configured to emit pieces of light having various colors such as red, green, and blue, and moreover, can be configured to emit white light.

In a situation where the light emitting layer 106 emits white light, a color filter can be provided under or on the light emitting layer 106.

For example, the color filter can be provided on the cathode 107 or can be provided under the planarization layer 103, and moreover, can be provided at various positions.

The cathode 107 can be provided on the light emitting layer 106, and particularly, can be provided in a plate shape on the whole surface of the substrate 101.

The cathode 107 can be a second pixel electrode of the organic light emitting diode.

In a situation where the light emitting display panel 100 according to the present disclosure uses the top emission type, the cathode 107 can include a transparent electrode, and for example, can include ITO or IZO.

In a situation where the light emitting display panel 100 according to the present disclosure uses the bottom emission type, the cathode 107 can include at least one of various metals such as Cu and a MoTi alloy.

In the present disclosure, the cathode 107 can include a boundary region cathode 107b, which is provided in a boundary groove (e.g., a trench or depressed region in the planarization layer 103) of a boundary region BA between two adjacent pixels 110, and a main cathode 107a which covers opening regions OA of the two adjacent pixels 110. The main cathode 107a can be provided in all regions, other than the boundary groove, of the substrate 101 as well as in the opening region OA. In this situation, the boundary region cathode 107b can be spaced apart and separated from the main cathode 107a. However, as described above, the boundary region cathode 107b and the main cathode 107a can be connected to each other at a connection portion provided in the boundary region BA. However, the boundary region cathode 107b can be physically, electrically, and completely spaced apart and separated from the main cathode 107a through the boundary groove 103a. Hereinafter, however, a light emitting display panel where the boundary region cathode 107b and the main cathode 107a are spaced apart from each other through the boundary groove 103a and are connected to each other at the connection portion will be described as an example of the present disclosure.

The boundary region cathode 107b and the main cathode 107a can be formed through the same process, and thus, can include the same material.

Here, the boundary region cathode 107b can be provided in a direction parallel to the $n^{th}$ gate line included in the substrate 101. Here, n can be a natural number which is less than or equal to g, where g is a positive integer.

For example, when three pixels 110 (e.g., sub-pixels) are arranged in a widthwise direction of FIGS. 3 to 5 (e.g., a widthwise direction of the light emitting display panel 100), the gate lines can be arranged in the widthwise direction of FIGS. 3 to 5, and in this situation, the three pixels 110 can be arranged in a direction parallel to at least one gate line (for example, the $n^{th}$ gate line GLn).

Therefore, as illustrated in FIGS. 3 to 5, the boundary region cathode 107b can be provided in a direction parallel to the $n^{th}$ gate line GLn included in the substrate 101 (for example, a widthwise direction of the substrate 101). In pixels illustrated in FIGS. 4 and 5, the boundary region cathode 107b can be provided in a direction differing from the $n^{th}$ gate line GLn (for example, a lengthwise direction of FIGS. 4 and 5).

That is, the boundary region cathode 107b can be provided at an outer portion of the anode 104 included in one pixel (e.g., boundary region cathode 107b can be disposed around a perimeter of the anode 104). The outer portion can include at least one of a left outer portion, a right outer portion, an upper outer portion, and a lower outer portion. The left outer portion can correspond to a left side of the anode, the right outer portion can correspond to a right side of the anode, the upper outer portion can correspond to an upper side of the anode, and the lower outer portion can correspond to a lower side of the anode. In the following description, the left outer portion, the right outer portion, the upper outer portion, and the lower outer portion can be respectively referred to as a first-side outer portion, a second-side outer portion, a third-side outer portion, and a fourth-side outer portion.

For example, in the pixels illustrated in FIG. 3, the boundary region cathode 107b can be selectively provided at only the left outer portion and the right outer portion, provided in a widthwise direction along the gate line, of the outer portion of the anode 104.

However, in the pixels illustrated in FIG. 4, the boundary region cathode 107b can be provided at all of the upper outer portion and the lower outer portion, provided in a direction differing from the gate line (for example, a lengthwise direction), of the outer portion of the anode 104 as well as the left outer portion and the right outer portion, provided in the widthwise direction along the gate line, of the outer portion of the anode 104 That is, in the pixels illustrated in FIG. 4, the boundary region cathode 107*b* can be provided at the upper outer portion and the lower outer portion of the anode 104 as well as the left outer portion and the right outer portion of the anode 104 (e.g., all around the perimeter of the anode 104).

Moreover, in the pixels illustrated in FIG. 5, the boundary region cathode 107*b* can be provided at the left outer portion and the right outer portion, provided in the widthwise direction along the gate line, of the outer portion of the anode 104 and can be provided at only one of the upper outer portion and the lower outer portion, provided in a direction differing from the gate line (for example, the lengthwise direction), of the outer portion of the anode 104. That is, in the pixels illustrated in FIG. 5, the boundary region cathode 107*b* can be provided at the left outer portion, the right outer portion, and the lower outer portion of the anode 104.

That is, the boundary region cathode 107*b* applied to the present disclosure can be provided a direction (for example, the widthwise direction of the substrate 101) provided along the gate line. That is, a lateral leakage current may largely occur between pixels adjacent to each other in the direction provided along the gate line, and thus, the boundary region cathode 107*b* can be provided along the gate line.

Moreover, the boundary region cathode 107*b* can be provided in a direction differing from the gate line (for example, the lengthwise direction of the substrate 101), or may not be provided.

That is, with respect to one pixel, the boundary region cathode 107*b* can be provided at a left portion and a right portion of each of pixels parallel to the gate line GL, and the boundary region cathode 107*b* can be provided in at least one side of an upper side and a lower side of a pixel or may not be provided at the upper side and the lower side of the pixel.

The boundary region cathode 107*b*, as illustrated in FIG. 6, can be provided in the boundary region BA. The boundary region BA can denote a region between adjacent anodes 104, or can denote a region overlapping the outer portion of the anode 104.

In the boundary region BA of the planarization layer 103, as illustrated in FIG. 6, the boundary groove 103*a* which is thinner in thickness than another region can be formed. That is, a height of the planarization layer 103 in the boundary groove 103*a* can be less than that of the planarization layer 103 in a region other than the boundary groove 103*a* (e.g., boundary groove 103*a* can be a type of trench or depression in the planarization layer 103).

In the boundary groove 103*a*, the bank 105 can be provided on the planarization layer 103. The bank 105 provided in the boundary groove 103*a* and the bank 105 provided outside the boundary groove 103*a* can be continuously formed, but can be spaced apart from each other.

In the boundary groove 103*a*, a light emitting layer can be provided on the bank 105. The light emitting layer provided in the boundary groove 103*a* can be spaced apart from the light emitting layer provided outside the boundary groove 103*a* based on a height of the boundary groove 103*a* and an undercut structure formed in the boundary groove 103*a* (e.g., light emitting layer portion 106*b* provided in the boundary groove 103*a* can be disposed under eaves or overhangs of the bank 105, and spaced apart from the light emitting layer portion 106*a* in the pixel).

In the following description, a light emitting layer provided in the boundary groove 103*a* or the boundary region BA can be referred to as a boundary region light emitting layer 106*b*, and a light emitting layer provided in a region other than the boundary groove 103*a* or the boundary region BA can be referred to as a main light emitting layer 106*a*. Accordingly, the light emitting layer 106 can include the main light emitting layer 106*a* and the boundary region light emitting layer 106*b*. In this situation, the main light emitting layer 106*a* can be spaced apart from the boundary region light emitting layer 106*b*.

In the boundary groove 103*a*, a boundary region cathode 107*b* can be provided on the boundary region light emitting layer 106*b*. The boundary region cathode 107*b* provided in the boundary groove 103*a* can be spaced apart from the main cathode 107*a* provided outside the boundary groove 103*a* based on a height of the boundary groove 103*a* and an undercut structure formed in the boundary groove 103*a* (e.g., boundary region cathode 107*b* provided in the boundary groove 103*a* can be disposed under eaves or overhangs of the bank 105, and spaced apart from the cathode 107*a* in the pixel).

As described above, because the main light emitting layer 106*a* is spaced apart from the boundary region light emitting layer 106*b*, a lateral leakage current through a light emitting layer between adjacent pixels can be prevented.

Moreover, even when the main light emitting layer 106*a* is not completely separated from the boundary region light emitting layer 106*b*, as described above, the main cathode 107*a* can be spaced apart from the boundary region cathode 107*b* at the boundary groove 103*a* provided in the boundary region BA, and thus, a lateral leakage current and leakage light through the light emitting layer 106 and the cathode 107 can be prevented between adjacent pixels.

Finally, the cathode 107 can be covered by a passivation layer.

In a situation where the light emitting layer 106 emits white light, the cathode 107 can be covered by the passivation layer, a color filter can be provided at a portion, corresponding to the anode 104, of an upper end of the passivation layer, and a black matrix can be provided at a portion, corresponding to the bank 105, of the upper end of the passivation layer. Another passivation layer can be further provided on the black matrix and the color filter. Each pixel can output, for example, one of red light, green light, white light, and blue light by using the color filter. However, as described above, the color filter can be provided at various positions under the planarization layer 103.

In a situation where the light emitting layer 106 emits light having a unique color, the color filter can be omitted.

The passivation layer can perform a function of an encapsulation layer. The passivation layer can include at least one inorganic film or at least one organic film, or can include at least one inorganic film and at least one organic film.

The other passivation layer can perform a function of an encapsulation layer. The other passivation layer can include at least one inorganic film or at least one organic film, or can include at least one inorganic film and at least one organic film.

Hereinafter, detailed structures of the light emitting display panel 100 according to the present disclosure illustrated in FIGS. 3 to 5 will be described with reference to FIGS. 7A to 12E. In this situation, all cross-sectional views in the boundary regions BA of the light emitting display panels 100 illustrated in FIGS. 3 to 5 are the same. That is, a cross-sectional view taken along line A-A' illustrated in FIG.

6 illustrates a cross-sectional surface taken along line A-A' illustrated in FIGS. 3 to 5. To provide an additional description, the light emitting display panels 100 illustrated in FIGS. 3 to 5 can have the same structure in the boundary region BA where the boundary groove 103a is provided. However, a structure where the boundary region cathode 107b is connected to the main cathode 107a can differ for each of the light emitting display panels 100 illustrated in FIGS. 3 to 5. Hereinafter, therefore, a structure where the boundary region cathode 107b is connected to the main cathode 107a will be described for each of the light emitting display panels 100 illustrated in FIGS. 3 to 5. Before describing a feature of each of the light emitting display panels 100 illustrated in FIGS. 3 to 5, a feature of the present disclosure applied to the light emitting display panels 100 illustrated in FIGS. 3 to 5 in common will be described.

First, the cathode 107 can include the boundary region cathode 107b and the main cathode 107a, and the boundary region BA can be provided outside each of the anodes 104. The boundary region cathode 107b can be provided in the boundary groove 103a included in the boundary region BA, and the main cathode 107a can be provided at a portion, other than the boundary groove 103a, of the display area BA. The boundary region cathode 107b can be spaced apart from the main cathode 107a at the boundary groove 103a.

The boundary region cathode 107b can be provided in a direction parallel to the $n^{th}$ gate line provided in the substrate.

The light emitting layer 106 can include the boundary region light emitting layer 106b provided in the boundary groove 103a and the main light emitting layer 106a provided at a portion, other than the boundary groove 103a, of the display area 120. The boundary region light emitting layer 106b can be spaced apart from the main light emitting layer 106a at the boundary groove 103a.

The boundary groove 103a can be formed in the boundary region BA in the planarization layer, and a height of the planarization layer in the boundary region BA can be less than a height of the planarization layer in a region other than the boundary region BA. A bank can be provided on the planarization layer 103 in the boundary groove 103a, the light emitting layer 106 can be provided on the bank provided in the boundary groove 103a, and the boundary region cathode 107b can be provided on the light emitting layer 106 provided in the boundary groove 103a.

The light emitting layer 106 can include the boundary region light emitting layer 106b provided in the boundary groove 103a and the main light emitting layer 106a provided at a portion, other than the boundary groove 103a, of the display area 120. The boundary region light emitting layer 106b can be spaced apart from the main light emitting layer 106a at the boundary groove 103a.

An end of the anode 104, as illustrated in FIG. 6, can protrude in a direction toward the boundary groove 103a (e.g., the anode 104 can have an eave or outcropping portion that hangs over the edge of the depression/trench in the planarization layer 103).

The end of the anode 104 (e.g., the outer portion of the anode 104) can overlap the boundary region cathode 107b based on an undercut structure formed under the outer portion of the anode 104 at the boundary groove 103a. However, as illustrated in FIG. 6, the end of the anode 104 (e.g., the outer portion of the anode 104) may not overlap the boundary region cathode 107b.

Finally, the boundary region cathode 107b and the main cathode 107a can be spaced apart from each other at a connection portion provided in the boundary region BA.

Figure 7A:
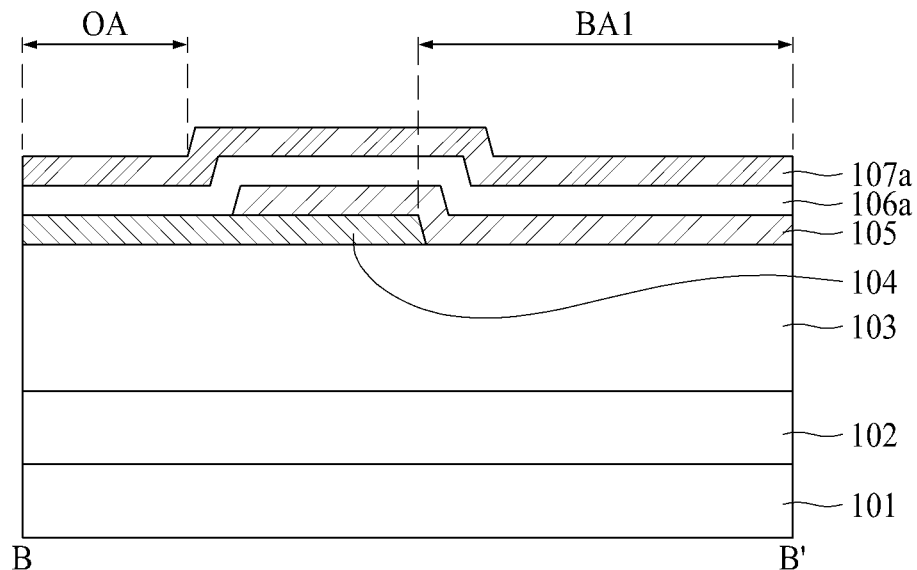
FIG. 7A is a diagram illustrating a cross-sectional surface taken along line B-B' illustrated in FIG. 3 according to an embodiment of the present disclosure.
Figure 7B:
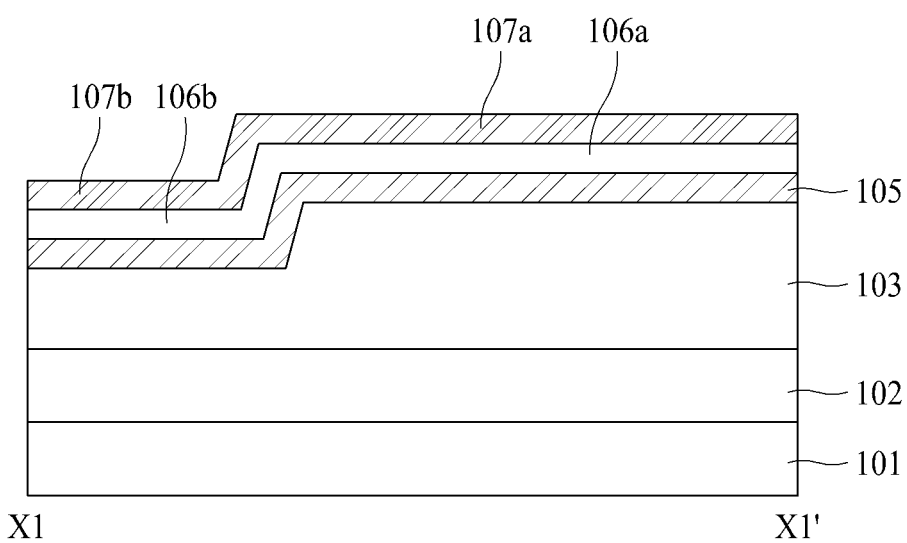
FIG. 7B is a diagram illustrating a cross-sectional surface taken along line X1-X1' illustrated in FIG. 3 according to an embodiment of the present disclosure.

FIG. 7A is an diagram illustrating a cross-sectional surface taken along line B-B' illustrated in FIG. 3, FIG. 7B is an diagram illustrating a cross-sectional surface taken along line X1-X1' illustrated in FIG. 3, and FIGS. 8A to 8H are diagrams illustrating a method of manufacturing the light emitting display panel illustrated in FIG. 3. In the following description, descriptions which are the same as or similar to descriptions given above with reference to FIGS. 1 to 6 are omitted or will be briefly given.

As described above, in pixels included in the light emitting display panel 100 illustrated in FIG. 3, the boundary region cathode 107b can be provided at only the left outer portion and the right outer portion of the corresponding pixel, provided in a widthwise direction along a gate line, of the outer portion of the anode 104.

That is, in the light emitting display panel 100 illustrated in FIG. 3, when the boundary region BA provided at the outer portion of one anode 104 includes a left boundary region, a right boundary region, an upper boundary region, and a lower boundary region, the boundary region cathode 107b can be provided in only the left boundary region and the right boundary region and the boundary region cathode 107b may not be provided in the upper boundary region and the lower boundary region, with respect to one pixel. To provide an additional description, the main cathode 107a can be continuously formed in the upper boundary region and the lower boundary region.

The boundary region cathode 107b can be provided at outer portions of the anodes 104 included in pixels connected to the $n^{th}$ gate line GLn included in the substrate 101 and can be provided in a direction parallel to the $n^{th}$ gate line GLn.

Particularly, the boundary region cathode 107b may only be provided at portions, provided in a direction parallel to the $n^{th}$ gate line GLn, of outer portions of anodes included in pixels connected to the $n^{th}$ gate line GLn provided in the substrate.

Therefore, the boundary region cathode 107b may not be provided at portions, which are adjacent to an $n-1^{th}$ gate line GLn−1 and an $n+1^{th}$ gate line GLn+1, of outer portions of anodes included in pixels connected to the $n^{th}$ gate line GLn provided in the substrate 101.

Moreover, a top surface of the planarization layer 103 in a boundary region BA, where the boundary region cathode 107b is not provided, of boundary regions BA between two adjacent pixels can be parallel to a top surface of the planarization layer 103 in an opening region OA.

That is, FIG. 7A illustrates a cross-sectional surface of a boundary region BA, where the boundary region cathode 107b is not provided, of boundary regions BA between two adjacent pixels as illustrated in FIG. 3, and a top surface of the planarization layer 103 in the boundary region BA where the boundary region cathode 107b is not provided can be parallel to a top surface of the planarization layer 103 in the opening region OA.

Therefore, as illustrated in FIG. 7A, the bank 105 can be provided at an upper end (e.g., upper surface) of the planarization layer 103 in the boundary region BA where the boundary region cathode 107b is not provided, the main light emitting layer 106a can be provided on the bank 105, and the main cathode 107a can be provided on the main light emitting layer 106a.

In the boundary region BA where the boundary region cathode 107b is not provided, the bank 105, the main light emitting layer 106a, and the main cathode 107a provided on the planarization layer 103 can be provided in common between two pixels configuring the boundary region BA.

To provide an additional description, as illustrated in FIG. 3, the boundary region cathode 107b can be provided at a left outer portion or a right outer portion of each of anodes included in pixels connected to the $n^{th}$ gate line GLn provided in the substrate, and thus, the boundary groove 103a can be provided at only the left outer portion or the right outer portion of each of the anodes, and portions, which are adjacent to the $n-1^{th}$ gate line GLn−1 and the $n+1^{th}$ gate line GLn+1, of the boundary region cathode 107b can be connected to the main cathode 107a. That is, a connection portion can be provided at the portions, which are adjacent to the $n-1^{th}$ gate line GLn−1 and the $n+1^{th}$ gate line GLn+1, of the boundary region cathode 107b.

Therefore, the boundary groove 103a may not be formed in an upper portion and a lower portion of the boundary region cathode 107b illustrated in FIG. 3, and thus, the boundary region cathode 107b and the main cathode 107a can be continuously formed in the upper portion and the lower portion of the boundary region cathode 107b.

That is, FIG. 7B illustrates a cross-sectional surface of each of the upper portion and the lower portion of the boundary region cathode 107b.

Hereinafter, a boundary region BA where the boundary region cathode 107b and the boundary groove 103a are not provided can be simply referred to as a normal boundary region.

Hereinafter, a method of manufacturing the light emitting display panel illustrated in FIG. 3 will be described with reference to FIGS. 3, 6, 7A, 7B, and 8A to 8H. In FIGS. 8A to 8H, (a) illustrates a method of manufacturing a cross-sectional surface illustrated in FIG. 6, and (b) illustrates a method of manufacturing a cross-sectional surface illustrated in FIG. 7A. That is, (a) illustrates a cross-sectional surface of the boundary region BA, and (b) illustrates a normal boundary region (for example, a cross-sectional surface taken along line B-B' of FIG. 3).

Figure 8A:
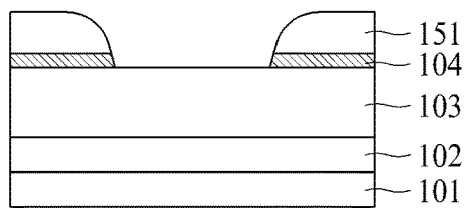
FIGS. 8A to 8H are diagrams illustrating a method of manufacturing the light emitting display panel illustrated in FIG. 3 according to an embodiment of the present disclosure.
Figure 8A:
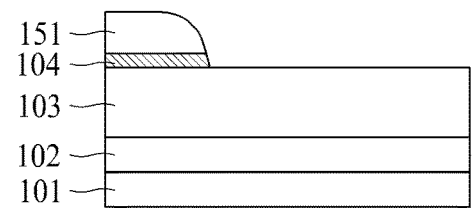

First, as illustrated in FIG. 8A, parts (a) and (b), the pixel driving circuit layer 102 and the planarization layer 103 can be provided on the substrate 101. The anode 104 patterned by an exposure and etching process using a photoresist 151 can be provided on the planarization layer 103.

Figure 8B:
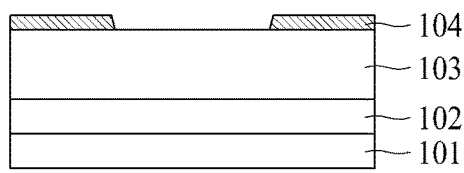
Figure 8B:
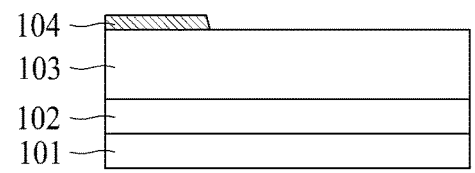

Subsequently, as illustrated in FIG. 8B, parts (a) and (b), the photoresist 151 provided on the anode 104 can be removed.

Figure 8C:
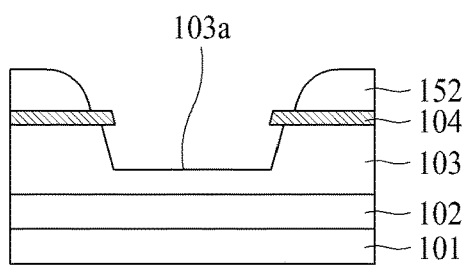
Figure 8C:
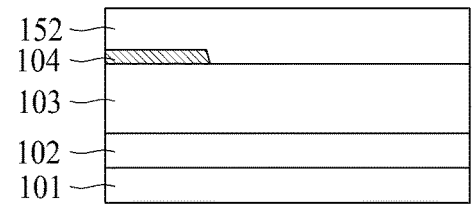

Subsequently, as illustrated in FIG. 8C, parts (a) and (b), a photoresist 152 can be provided in the boundary region BA and the normal boundary region, and as illustrated in (a), the boundary groove 103a can be formed in the boundary region BA by a mask and a dry etching process for forming the boundary groove 103a. That is, the boundary groove 103a can be formed by etching the planarization layer 103 (e.g., to create a trench or groove 103a in the planarization layer 103).

Particularly, the planarization layer, which supports the anode 104 at an end of the anode 104, can be removed by a dry etching process, and thus, an undercut structure can be formed under the anode 104 which protrudes toward the boundary groove 103a. That is, an end of the anode 104 can protrude toward the boundary groove 103a, and an undercut structure can be formed under the anode 104 which protrudes. In FIGS. 6 and 8C, the undercut structure can denote a form where the planarization layer 103 is recessed toward the anode 104.

In this situation, as illustrated in par (b) of FIG. 8C, the planarization layer 103 provided in the normal boundary region can be covered by the photoresist 152, and thus, may not be etched.

Figure 8D:
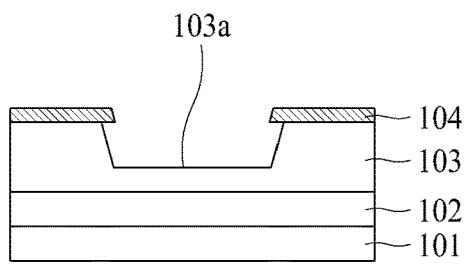
Figure 8D:
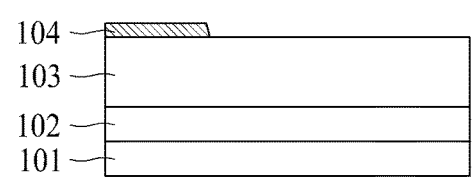

Subsequently, as illustrated in FIG. 8D, parts (a) and (b), the photoresist 152 used for forming the boundary groove 103a can be removed.

Figure 8E:
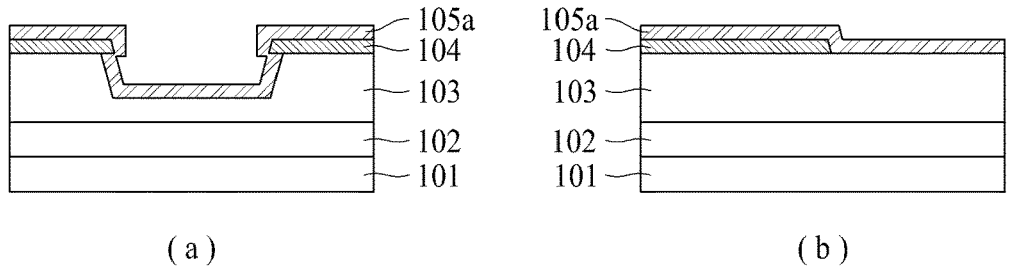

Subsequently, as illustrated in FIG. 8E (a) and (b), a bank material 105a for forming the bank 105 can be provided on a whole surface of the display area 120. The bank material 105a can include an inorganic material such as silicon oxide ($SiO_2$). That is, the bank material 105a can be formed of an inorganic material, and thus, when the bank material 105a is provided in the boundary groove 103a, the bank material 105a can be provided along a shape of the undercut structure.

To provide an additional description, as described above with reference to FIGS. 8C and 8D, the bank material 105a can be formed of an inorganic material such as $SiO_2$, to prevent the undercut structure from being planarized by the bank material 105a.

In this situation, as illustrated in part (a) of FIG. 8E, the bank material 105a can be provided in the boundary groove 103a.

Figure 8F:
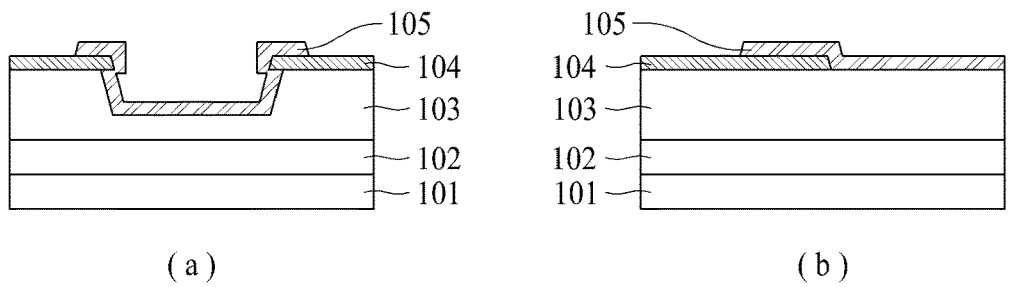

Subsequently, as illustrated in FIG. 8F, parts (a) and (b), the bank material 105a can be patterned by a dry etching process, and thus, the bank 105 can be formed.

In this situation, as illustrated in part (a) of FIG. 8F, the bank material 105a can be patterned and thus the opening region OA can be formed in the boundary region BA, and as illustrated in part (b) of FIG. 8F, the bank material 105a can be the bank 105 in the normal boundary region.

Figure 8G:
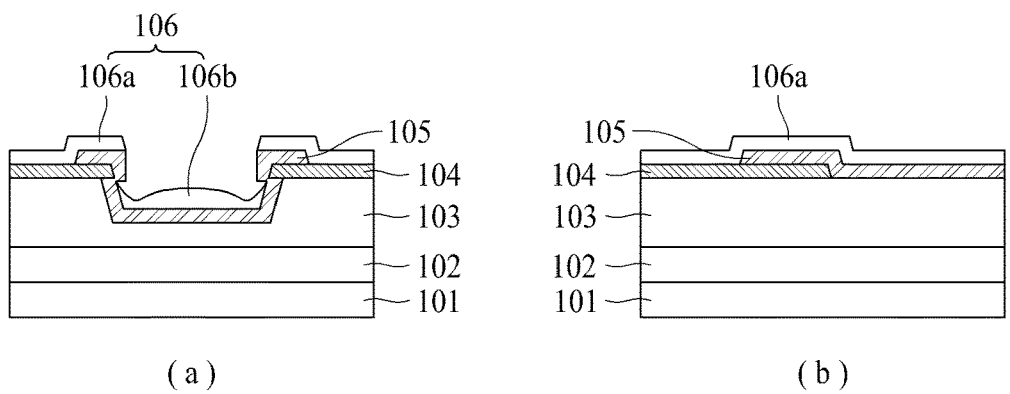

Subsequently, as illustrated in FIG. 8G, parts (a) and (b), the light emitting layer 106 can be provided on the whole surface of the display area 120.

In this situation, as illustrated in part (a) of FIG. 8G, the boundary region light emitting layer 106b and the main light emitting layer 106a can be separated from each other in the boundary region BA based on a height difference of the boundary groove 103a and an undercut structure of the boundary groove 103a. Particularly, a charge generating layer (CGL) configuring the light emitting layer 106 can be separated by an undercut structure under the anode 104, and thus, the boundary region light emitting layer 106b and the main light emitting layer 106a can be formed.

Figure 8H:
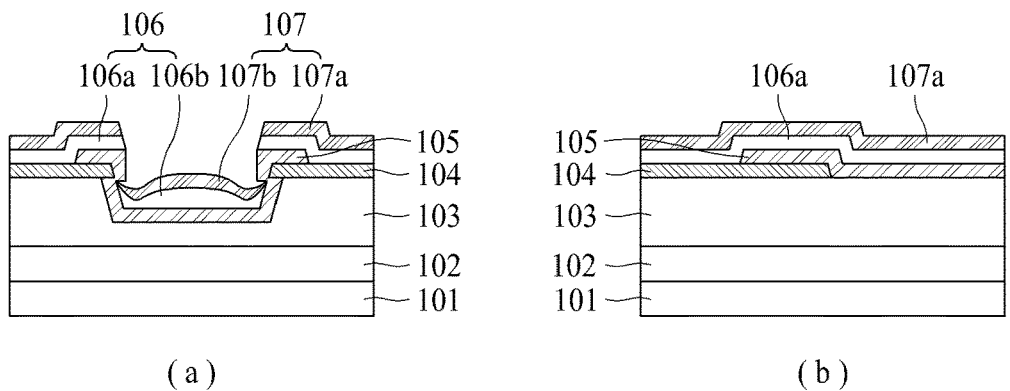

Finally, as illustrated in FIG. 8H, parts (a) and (b), the cathode 107 can be provided on the whole surface of the display area 120.

In this situation, the cathode can be divided into the boundary region cathode 107b and the main cathode 107a based on the height difference of the boundary groove 103a and the undercut structure of the boundary groove 103a.

According to the present disclosure, the boundary groove 103a can be formed in left and right regions between pixels corresponding to a main path for a lateral leakage current and leakage light, and the boundary region light emitting layer 106b, the main light emitting layer 106a, the boundary region cathode 107b, and the main cathode 107a can be formed by the boundary groove 103a. Accordingly, a lateral leakage current and leakage light can be blocked by the boundary region light emitting layer 106b, the main light emitting layer 106a, the boundary region cathode 107b, and the main cathode 107a which are separated from one another through the boundary groove 103a (e.g., forming a type of moat or trench between adjacent pixels).

Moreover, the bank 105, the main light emitting layer 106a, and the main cathode 107a can be continuously provided in adjacent pixels in a region, where the boundary groove 103a is not formed, of the planarization layer 103. Accordingly, the main cathode 107a can cover all pixels and can be applied to all pixels in common.

The features of the light emitting display panels described above with reference to FIGS. 3, 6, 7A, 7B, and 8A to 8H will be briefly described below.

First, the boundary region cathode 107b can be provided between anodes 104 included in pixels connected to the $n^{th}$ gate line GLn included in the substrate.

Subsequently, the boundary region cathode 107b can be provided at portions, which are adjacent to the $n-1^{th}$ gate line GLn-1 and the $n+1^{th}$ gate line GLn+1, of boundary regions BA included in the pixels connected to the $n^{th}$ gate line GLn included in the substrate.

Subsequently, the boundary groove 103a can be provided in each of regions facing the anodes 104 included in the pixels connected to the $n^{th}$ gate line GLn included in the substrate, and the boundary region cathode 107b can be provided in the boundary groove 103a.

Subsequently, a connection portion can be provided at each of portions, which are adjacent to the $n-1^{th}$ gate line GLn-1 and the $n+1^{th}$ gate line GLn+1, of the boundary groove 103a, and the boundary region cathode 107b and the main cathode 107a provided in the boundary groove 103a can be connected to each other at the connection portion. In the light emitting display panel illustrated in FIG. 3, the connection portion can be an upper portion and a lower portion of the boundary region cathode 107b, and as illustrated in FIG. 7B, the upper portion and the lower portion of the boundary region cathode 107b can be connected to the main cathode 107a.

Figure 9A:
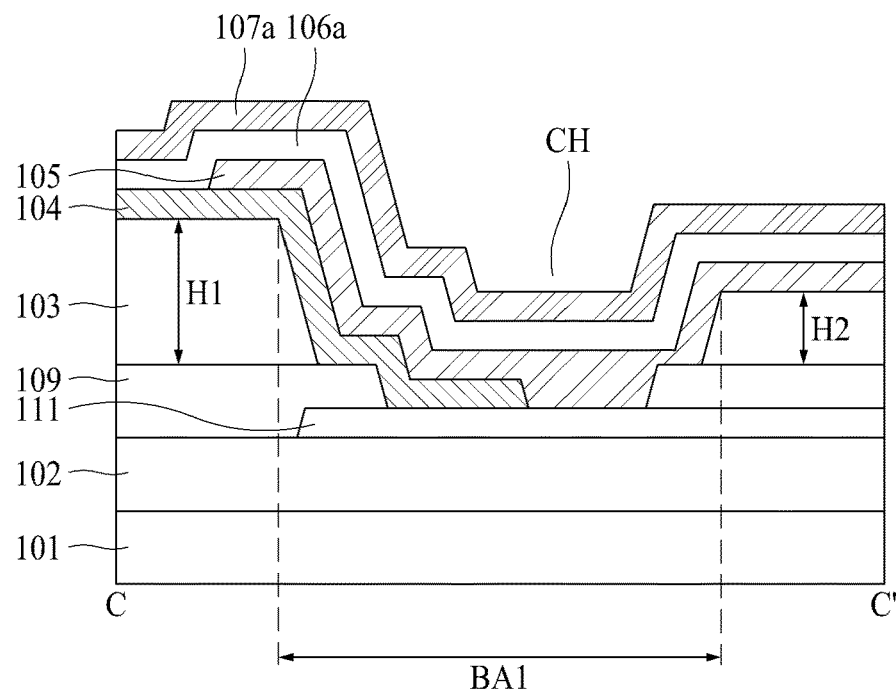
FIG. 9A is a diagram illustrating a cross-sectional surface taken along line C-C' illustrated in FIG. 4 according to an embodiment of the present disclosure.
Figure 9B:
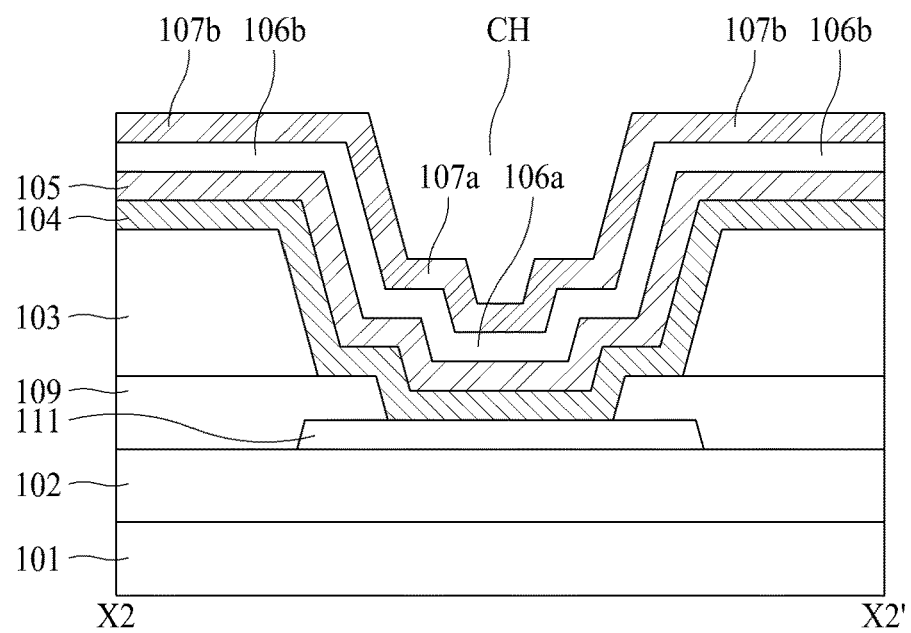
FIG. 9B is a diagram illustrating a cross-sectional surface taken along line X2-X2' illustrated in FIG. 4 according to an embodiment of the present disclosure.

Finally, the light emitting layer 106 can include the boundary region light emitting layer 106b provided in the boundary groove 103a and the main light emitting layer 106a provided at a portion, other than the boundary groove 103a, of the display area 120, and the boundary region light emitting layer 106b and the main light emitting layer 106a can be apart from each other at the boundary groove 103a and can be connected to each other at the connection portion as illustrated FIG. 7B. FIG. 9A is an diagram illustrating a cross-sectional surface taken along line C-C' illustrated in FIG. 4, FIG. 9B is an diagram illustrating a cross-sectional surface taken along line X2-X2' illustrated in FIG. 4, and FIGS. 10A to 10E are diagrams illustrating a method of manufacturing the light emitting display panel illustrated in FIG. 4. In the following description, descriptions which are the same as or similar to descriptions given above with reference to FIGS. 1 to 6 are omitted or will be briefly given.

As described above, in the pixels included in the light emitting display panel 100 illustrated in FIG. 4, the boundary region cathode 107b can be provided at the upper outer portion and the lower outer portion, provided in a direction differing from the gate line (for example, a lengthwise direction), of the outer portion of the anode 104 as well as the left outer portion and the right outer portion, provided in the widthwise direction along the gate line, of the outer portion of the anode 104. That is, in the pixels illustrated in FIG. 4, the boundary region cathode 107b can be provided at the upper outer portion and the lower outer portion of the anode 104 as well as the left outer portion and the right outer portion of the anode 104

To provide an additional description, in the light emitting display panel 100 illustrated in FIG. 4, with respect to one pixel, the boundary region cathode 107b can be provided in all of an upper boundary region, a lower boundary region, a left boundary region, and a right boundary region (e.g., around the perimeter of the anode 104).

In this situation, in the light emitting display panel 100 illustrated in FIG. 4, the boundary region cathode 107b can be provided at portions, other than a portion overlapping a contact hole CH connecting the anode 104 to the driving transistor Tdr, of the outer portion of the anode 104 included in one pixel 110. That is, the boundary groove 103a where the boundary region cathode 107b and the connection portion where the contact hole CH is provided can be provided in the boundary region BA.

That is, the boundary groove 103a can be provided in a region, except the contact hole CH, of the outer of the anode 104. To provide an additional description, the boundary region cathode 107b surrounding the anode 104 can be formed in the boundary groove 103a in FIG. 4, and the boundary region cathode 107b and the main cathode 107a can be connected to each other in the contact hole CH. A portion, where the contact hole CH is provided, of the boundary region BA can be referred to as a connection portion. That is, as illustrated in FIG. 4, the main cathode 107a can be provided in the region where the contact hole CH is provided (rather than the boundary region cathode 107b), and the main cathode 107a provided in the contact hole CH can be connected to the boundary region cathode 107b.

Therefore, in the light emitting display panel 100 illustrated in FIG. 4, the main cathodes 107a respectively provided in adjacent pixels can be connected to each other through the region where the contact hole CH is provided, and the main cathode 107a can be connected to the boundary region cathode 107b through the contact hole CH.

To provide an additional description, the contact hole CH connecting the anode 104 to the driving transistor Tdr can be provided at a connection portion of an outer portion of the anode 104 or the boundary region BA, and the boundary groove 103a can be provided at a portion, except the connection portion, of the outer portion of the anode 104 or the boundary region BA.

In this situation, FIG. 9A illustrates a cross-sectional surface taken along line C-C' illustrated in FIG. 4 and is an diagram illustrating a cross-sectional surface of the contact hole CH.

In the region where the contact hole CH is provided, an insulation layer 109 can be further provided between the pixel driving circuit layer 102 and the planarization layer 103. However, the insulation layer 109 can be provided on the whole surface of the substrate 101 as well as the region where the contact hole CH is provided.

A first electrode 111, which is connected to a first terminal of the driving transistor Tdr and is provided on a top surface of the pixel driving circuit layer 102, can be exposed through the contact hole CH which passes through the insulation layer 109 and the planarization layer 103. The first electrode 111 can be connected to the anode 104, provided on the planarization layer 103, in the contact hole CH.

In the contact hole CH, the bank 105 can be provided on the anode 104 and the first electrode 111. The light emitting layer 106 (particularly, the main light emitting layer 106a and the main cathode 107a) can be provided on the bank 105.

That is, the main light emitting layer 106a and the main cathode 107a respectively provided in adjacent pixels can be connected to each other in the contact hole CH.

To provide an additional description, a region where the contact hole CH is provided can be referred to as a normal boundary region.

A height H1 of a region, where the anode 104 is provided, of the planarization layer 103 where the contact hole CH is provided, as illustrated in FIG. 9A, can be greater than a height H2 of a region where the anode 104 is not provided.

Such a height difference can be because a planarization layer where the anode 104 is not provided is etched once more than a planarization layer where the anode 104 is provided. This will be described below with reference to FIGS. 10A to 10E.

Hereinafter, a method of manufacturing the light emitting display panel illustrated in FIG. 4 will be described with reference to FIGS. 4, 6, 9A, 9B, and 10A to 10E. In FIGS. 10A to 10E, (a) illustrates a method of manufacturing a cross-sectional surface illustrated in FIG. 6, and (b) illustrates a method of manufacturing a cross-sectional surface illustrated in FIG. 9A. That is, (a) illustrates a cross-sectional surface of the boundary region BA, and (b) illustrates a normal boundary region (for example, a cross-sectional surface taken along line C-C' of FIG. 4).

Figure 10A:
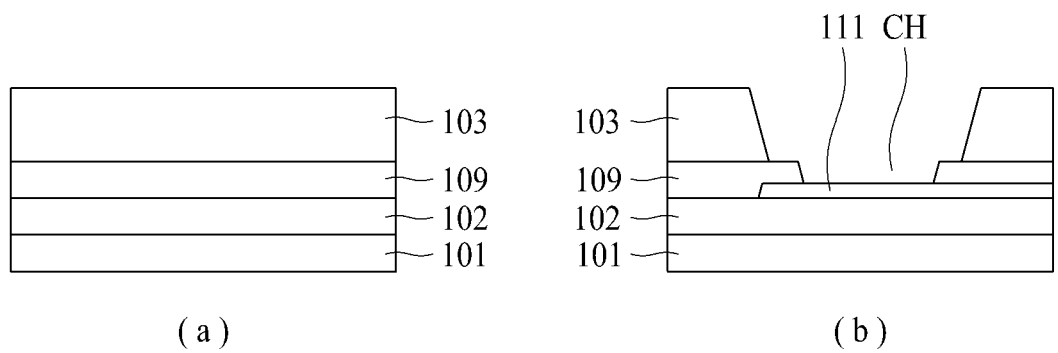
FIGS. 10A to 10E are diagrams illustrating a method of manufacturing the light emitting display panel illustrated in FIG. 4 according to an embodiment of the present disclosure.

First, as illustrated in FIG. 10A, parts (a) and (b), the pixel driving circuit layer 102, the first electrode 111, the insulation layer 109, and the planarization layer 103 can be provided on the substrate 101.

The contact hole CH can be formed by an exposure and etching process using a photoresist. The first electrode 111 provided under the insulation layer 109 can be exposed through the contact hole CH.

Figure 10B:
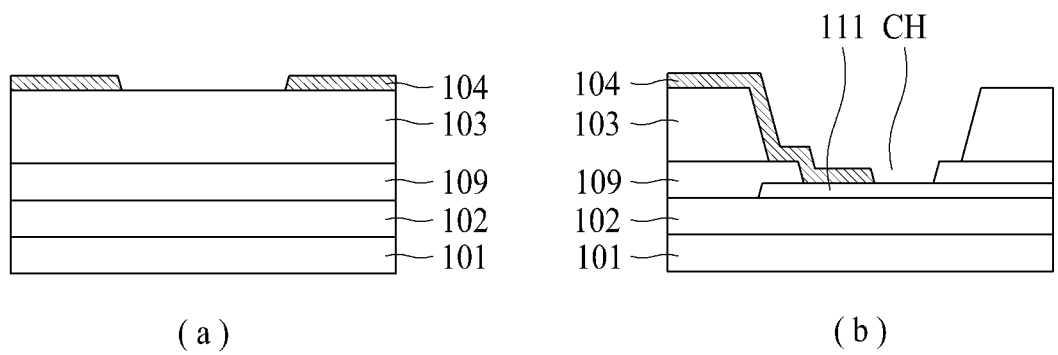

Subsequently, as illustrated in FIG. 10B, parts (a) and (b), the anode 104 can be provided on the planarization layer 103.

In this situation, as illustrated in part (b) of FIG. 10B, the anode 104 can be provided at only one side of the planarization layer 103 where the contact hole CH is provided, and the anode 104 formed in the contact hole CH can be connected to the first electrode 111.

A portion of the first electrode 111 can be covered by the anode 104, and the other portion thereof can be covered by the bank 105 in a subsequent process. That is, in order to connect the main cathodes 107a between pixels without adding a mask, the anode 104 can cover only a portion of the first electrode 111, in the contact hole CH. Also, the other portion of the first electrode 111 uncovered by the anode 104 can perform a function of an etch stopper in forming the boundary groove 103a in a subsequent process.

Figure 10C:
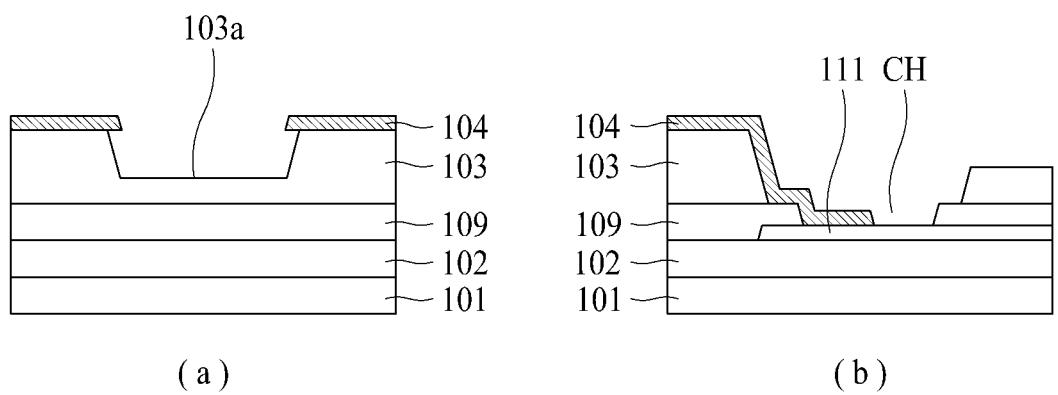

Subsequently, as illustrated in FIG. 10C part (a), the boundary groove 103a can be formed in the boundary region BA through dry etching. That is, the boundary groove 103a can be formed by etching the planarization layer 103.

Particularly, the planarization layer which supports the anode 104 at an end of the anode 104 can be removed by a dry etching process, and thus, an undercut structure can be formed under the anode 104 which protrudes toward the boundary groove 103a. That is, an end of the anode 104 can protrude toward the boundary groove 103a. To provide an additional description, an undercut structure can be formed in the boundary groove 103a by using the anode 104 as a mask.

In this situation, in performing a process of etching the planarization layer 103 in the boundary region BA through a dry etching process, as illustrated in part (b) of FIG. 10C, the planarization layer 103 where the anode 104 is not provided can be etched in the contact hole CH. However, the planarization layer 103 where the anode 104 is provided can be covered by the anode 104, and thus, may not be etched.

A height H1 of a region, where the anode 104 is provided, of the planarization layer 103 where the contact hole CH is provided, as illustrated in FIGS. 9A and 10C, can be greater than a height H2 of a region where the anode 104 is not provided.

Moreover, in performing a process of forming an undercut structure under the anode 104 in the boundary groove 103a, an undercut structure may not be formed under the anode 104 in the contact hole CH because the first electrode 111 acts as an etch stopper in the contact hole CH.

Figure 10D:
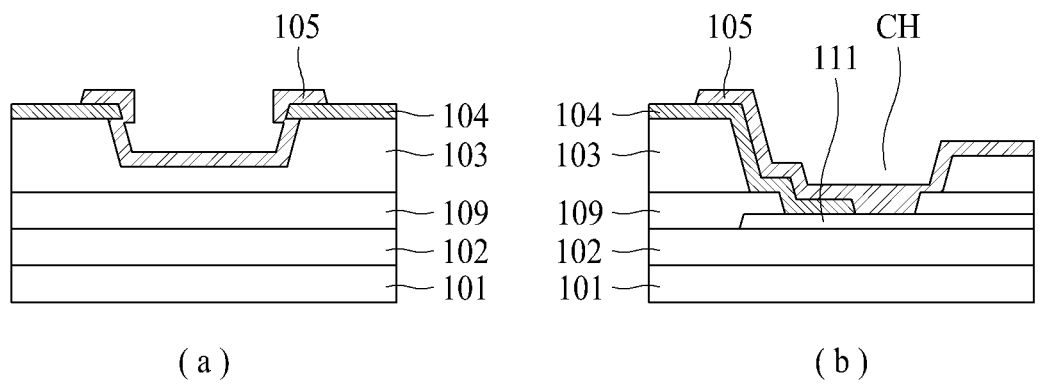

Subsequently, as illustrated in FIG. 10D, parts (a) and (b), the bank 105 can be provided in the boundary region BA and the normal boundary region. The bank 105 can include an inorganic material such as $SiO_2$. That is, the bank 105 can include an inorganic material, and thus, when the bank 105 is provided in the boundary groove 103a, the bank 105 can be provided along a shape of the undercut structure.

To provide an additional description, as described above with reference to FIG. 10C, the bank 105 can be formed of an inorganic material, such as $SiO_2$, to prevent the undercut structure from being planarized by the bank 105.

In this situation, as illustrated in part (a) of FIG. 10D, the opening region OA can be formed in the boundary region BA, and as illustrated in part (b) of FIG. 10D, the first electrode 111 can be completely covered by the bank 105.

Figure 10E:
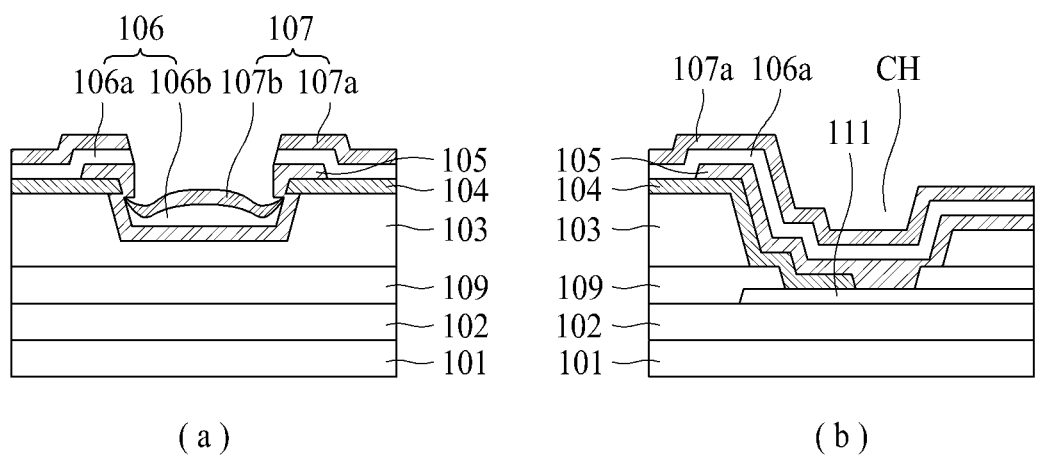

Finally, as illustrated in FIG. 10E, parts (a) and (b), the light emitting layer 120 can be provided on the whole surface of the display area 120.

In this situation, as illustrated in part (a) of FIG. 10E, the boundary region light emitting layer 106b and the main light emitting layer 106a can be separated and spaced apart from each other in the boundary region BA based on a height difference of the boundary groove 103a and an undercut structure of the boundary groove 103a. Particularly, a charge generating layer (CGL) configuring the light emitting layer 106 can be separated by an undercut structure under the anode 104, and thus, the boundary region light emitting layer 106b and the main light emitting layer 106a can be formed.

Moreover, the cathode 107 can be provided on the whole surface of the display area 120. In this situation, the cathode 107 can be divided into the boundary region cathode 107b and the main cathode 107a based on the height difference of the boundary groove 103a and the undercut structure of the boundary groove 103a.

That is, as illustrated in FIG. 10E part (b), the main cathode 107a can be continuously formed in and across the contact hole CH provided between adjacent pixels, and as illustrated in part (a) of FIG. 10E, the cathode 107 can be divided into the boundary region cathode 107b and the main cathode 107a in the boundary region BA.

According to the present disclosure, the boundary groove 103a can be formed in upper and lower regions between pixels as well as left and right regions between pixels corresponding to a main path for a lateral leakage current and leakage light, and the boundary region light emitting layer 106b, the main light emitting layer 106a, the boundary region cathode 107b, and the main cathode 107a can be formed by the boundary groove 103a. Accordingly, a lateral leakage current and leakage light can be blocked by the boundary region light emitting layer 106b, the main light emitting layer 106a, the boundary region cathode 107b, and the main cathode 107a which are separated from one another through the boundary groove 103a.

Moreover, the bank 105, the main light emitting layer 106a, and the main cathode 107a can be continuously provided in adjacent pixels in a region, where the boundary groove 103a is formed, of the planarization layer 103. Accordingly, the main cathode 107a can cover all pixels and can be applied to all pixels in common.

The features of the light emitting display panels described above with reference to FIGS. 4, 6, 9A, 9B, and 10A to 10E will be briefly described below.

First, the contact hole CH connecting the anode 104 to the driving transistor Tdr can be provided at a connection portion provided in the boundary region BA, and a boundary groove can be provided at a portion, except for in the contact hole CH, of the boundary region BA. The boundary region cathode 107b and the main cathode 107a can be spaced apart from each other in the boundary groove 103a and can be connected to each other at a connection portion.

Subsequently, the light emitting layer 106 can include the boundary region light emitting layer 106b provided in the boundary groove 103a and the main light emitting layer 106a provided at a portion, other than the boundary groove 103a, of the display area 120, and the boundary region light emitting layer 106b and the main light emitting layer 106a can be spaced apart from each other at the boundary groove 103a.

Subsequently, an insulation layer can be further provided between the pixel driving circuit layer and the planarization layer, and a first electrode connected to a first terminal of the driving transistor and provided on a top surface of the pixel driving circuit layer can be exposed through the contact hole CH passing through the insulation layer and the planarization layer. The first electrode can be connected to the anode 104, and the bank 105 can be provided on the anode 104 and the first electrode 111. The main light emitting layer 106a and the main cathode 107a can be provided on the bank provided in the contact hole CH, and the main light emitting layer 106a and the main cathode 107a provided in the contact hole CH can be connected to the boundary region light emitting layer 106b and the boundary region cathode 107b provided outside the contact hole CH.

Finally, a height H1 of a region, where the anode 104 is provided, of the planarization layer 103 where the contact hole CH is provided can be greater than a height H2 of a region where the anode 104 is not provided.

Figure 11A:
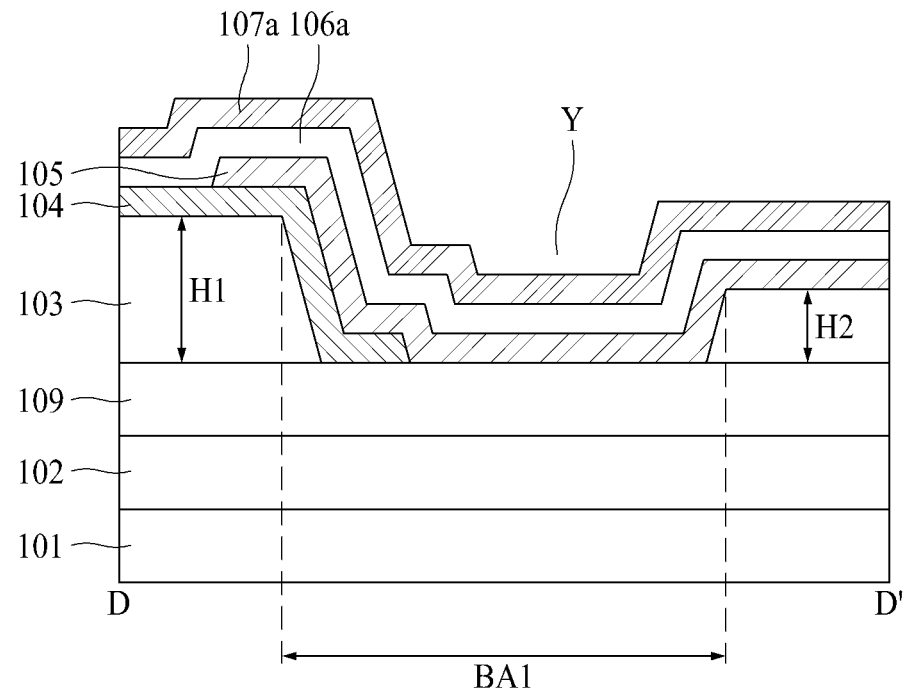
FIG. 11A is a diagram illustrating a cross-sectional surface taken along line D-D' illustrated in FIG. 5 according to an embodiment of the present disclosure.
Figure 11B:
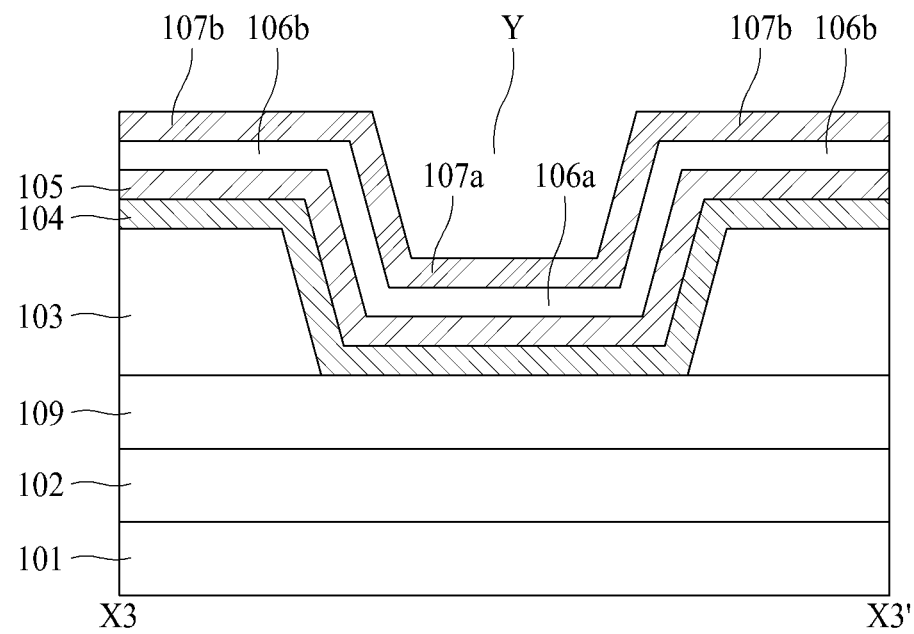
FIG. 11B is a diagram illustrating a cross-sectional surface taken along line X3-X3' illustrated in FIG. 5 according to an embodiment of the present disclosure.

FIG. 11A is an diagram illustrating a cross-sectional surface taken along line D-D' illustrated in FIG. 5, FIG. 11B is an diagram illustrating a cross-sectional surface taken along line X3-X3' illustrated in FIG. 5, and FIGS. 12A to 12E are diagrams illustrating a method of manufacturing the light emitting display panel illustrated in FIG. 5. In the following description, descriptions which are the same as or similar to descriptions given above with reference to FIGS. 1 to 6 are omitted or will be briefly given.

As described above, in the pixels included in the light emitting display panel 100 illustrated in FIG. 5, the boundary region cathode 107b can be provided at one of an upper outer portion and a lower outer portion, provided in a direction differing from a gate line (for example, a lengthwise direction), of an outer portion of the anode 104.

To provide an additional description, in the light emitting display panel 100 illustrated in FIG. 5, with respect to one pixel, the boundary region cathode 107b can be provided in regions except an upper boundary region among the upper boundary region, a lower boundary region, a left boundary region, and a right boundary region.

In this situation, in the pixels included in the light emitting display panel 100 illustrated in FIG. 5, the boundary region cathode 107b can overlap a portion, except a connection portion, of the outer portion of the anode 104 included in the pixel connected to the $n^{th}$ gate line GLn included in the substrate 101, and the connection portion can be formed in a region (e.g., an upper outer portion) facing the $n^{th}$ gate line GLn. That is, the boundary groove 103a where the boundary region cathode 107b is provided and a connection portion where a connection hole Y is provided can be provided in the boundary region BA.

However, when a contact hole connecting the anode 104 to the driving transistor Tdr is provided between the $n^{th}$ gate line GLn and the $n-1^{th}$ gate line GLn−1, the connection portion can be formed in a region (e.g., a lower boundary region) facing the $n+1^{th}$ gate line GLn+1. The connection hole Y can be formed in the connection portion.

Moreover, the connection portion can be formed in at least one of the region facing the $n^{th}$ gate line GLn and the region facing the $n+1^{th}$ gate line GLn+1. Accordingly, the connection portion can be provided in at least one of an upper portion and a lower portion of the pixel.

In this situation, as illustrated in FIG. 5, the main cathode 107a (instead of the boundary region cathode 107b) can be provided in a region where the connection portion (e.g., the connection hole Y) is provided.

Therefore, in the pixels included in the light emitting display panel 100 illustrated in FIG. 5, the main cathodes 107a respectively provided in adjacent pixels can be connected to each other through the connection hole Y. Also, the main cathode 107a and the boundary region cathode 107b can be connected to each other through the connection hole Y.

To provide an additional description, the boundary region cathode 107b can be provided at a portion, except a connection, of the outer portion of the anode 104 included in one pixel, and the connection hole Y connecting the anode 104 to the driving transistor Tdr can be provided in the connection portion.

In this situation, FIGS. 11A and 11B illustrate a cross-sectional surface of the connection hole Y.

In a region where the connection hole Y is provided, an insulation layer 109 can be further provided between the pixel driving circuit layer 102 and the planarization layer 103. However, the insulation layer 109 can be provided on the whole surface of the substrate 101 as well as a region where the connection hole Y is provided.

That is, in the connection portion, the insulation layer 109 can be exposed through the connection hole Y which is formed in the planarization layer 103, and the bank 105 can cover the insulation layer 109 exposed at the connection hole Y. The light emitting layer 106 (particularly, the main light emitting layer 106a and the main cathode 107a) can be provided on the bank 105.

That is, the main light emitting layer 106a and the main cathode 107a respectively provided in adjacent pixels can be connected to each other in the connection hole Y.

To provide an additional description, a region where the connection hole Y is provided can be referred to as a normal boundary region.

A height H1 of a region, where the anode 104 is provided, of the planarization layer 103 where the connection hole Y is provided, as illustrated in FIG. 11A, can be greater than a height H2 of a region where the anode 104 is not provided.

Such a height difference can be because a planarization layer where the anode 104 is not provided is etched once more than a planarization layer where the anode 104 is provided. This will be described below with reference to FIGS. 12A to 12E.

The anode 104 can cover a portion of the insulation layer 109 exposed at the connection hole Y.

Hereinafter, a method of manufacturing the light emitting display panel illustrated in FIG. 4 will be described with reference to FIGS. 5, 6, 11A, 11B, and 12A to 12E. In FIGS. 12A to 12E, (a) illustrates a method of manufacturing a cross-sectional surface illustrated in FIG. 6, and (b) illustrates a method of manufacturing a cross-sectional surface illustrated in FIG. 11A. That is, (a) illustrates a cross-sectional surface of the boundary region BA, and (b) illustrates a normal boundary region (for example, a cross-sectional surface taken along line D-D' of FIG. 5).

Figure 12A:
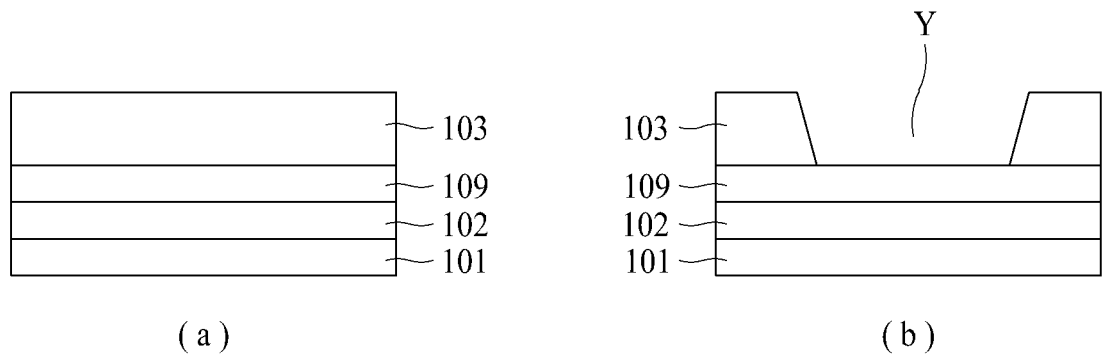
FIGS. 12A to 12E are diagrams illustrating a method of manufacturing the light emitting display panel illustrated in FIG. 5 according to an embodiment of the present disclosure.

First, as illustrated in FIG. 12A, parts (a) and (b), the pixel driving circuit layer 102, the insulation layer 109, and the planarization layer 103 can be provided on the substrate 101.

The connection hole Y can be formed by an exposure and etching process using a photoresist. A portion of the insulation layer 109 can be exposed through the connection hole Y.

Figure 12B:
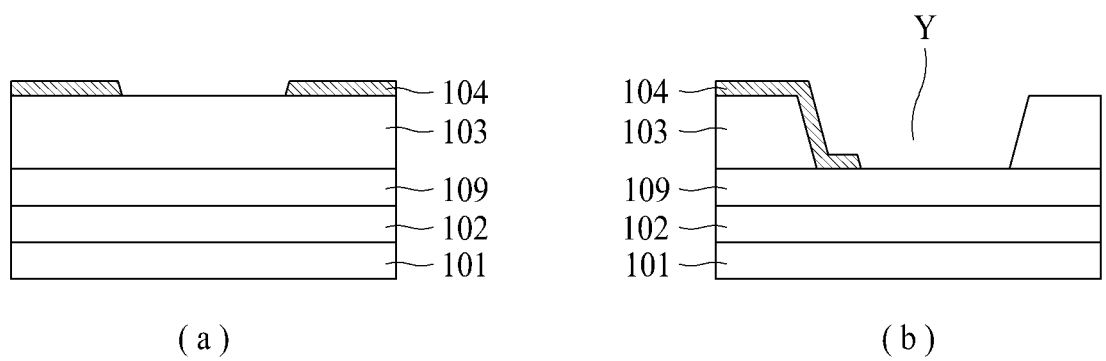

Subsequently, as illustrated in FIG. 12B, parts (a) and (b), the anode 104 can be provided on the planarization layer 103.

In this situation, as illustrated in part (b) of FIG. 12B, the anode 104 can be provided at only one side, where the connection hole Y is provided, of the planarization layer 103, and the anode 104 formed in the connection hole Y can cover a portion of the insulation layer 109 exposed at the connection hole Y.

That is, a portion of the insulation layer 109 exposed at the connection hole Y can be covered by the anode 104, and the other portion thereof can be covered by the bank 105 in a subsequent process. That is, in order to connect the main cathodes 107a between pixels without adding a mask, the anode 104 can cover only a portion of the insulation layer 109, in the connection hole Y. Also, the other portion of the insulation layer 109 uncovered by the anode 104 can perform a function of an etch stopper in forming the boundary groove 103a in a subsequent process.

Figure 12C:
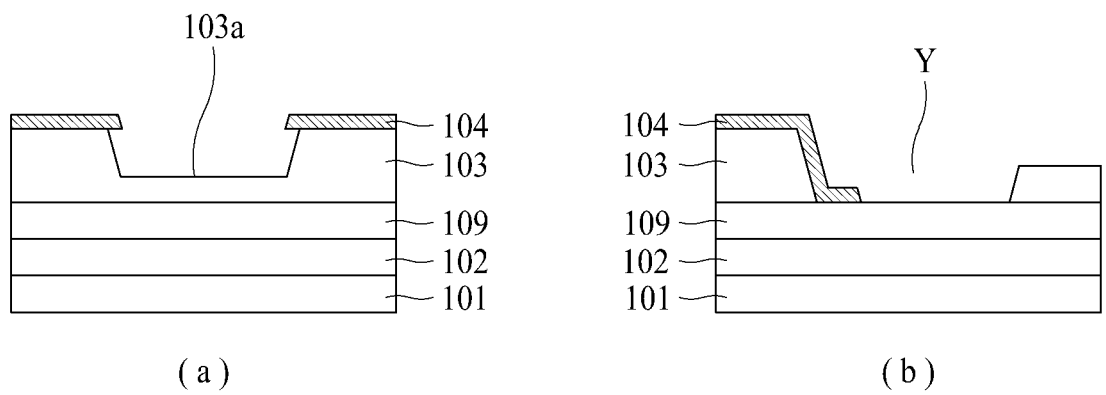

Subsequently, as illustrated in FIG. 12C part (a), the boundary groove 103a can be formed in the boundary region BA through dry etching. That is, the boundary groove 103a can be formed by etching the planarization layer 103.

Particularly, the planarization layer which supports the anode 104 at an end of the anode 104 can be removed by a dry etching process, and thus, an undercut structure can be formed under the anode 104 which protrudes toward the boundary groove 103a. That is, an end of the anode 104 can protrude toward the boundary groove 103a. To provide an additional description, an undercut structure can be formed in the boundary groove 103a by using the anode 104 as a mask.

In this situation, in performing a process of etching the planarization layer 103 in the boundary region BA through a dry etching process, as illustrated in part (b) of FIG. 12C, the planarization layer 103 where the anode 104 is not provided can be etched in the connection hole Y. However, the planarization layer 103 where the anode 104 is provided can be covered by the anode 104, and thus, may not be etched.

A height H1 of a region, where the anode 104 is provided, of the planarization layer 103 where the connection hole Y is provided, as illustrated in FIGS. 11A and 12C, can be greater than a height H2 of a region where the anode 104 is not provided.

Moreover, in performing a process of forming an undercut structure under the anode 104 in the boundary groove 103a, an undercut structure may not be formed under the anode 104 in the connection hole Y because the insulation layer 109 acts as an etch stopper in the connection hole Y.

To this end, the insulation layer 109 can be formed of a material which is not etched in dry-etching the bank 105. For example, the insulation layer 109 can be formed of an inorganic material, an organic material, or a combination layer of an inorganic material or an organic material.

Figure 12D:
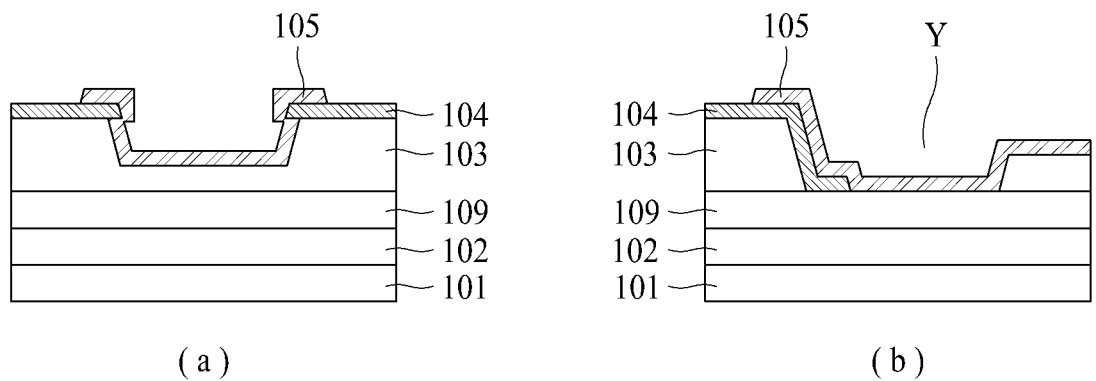

Subsequently, as illustrated in FIG. 12D, parts (a) and (b), the bank 105 can be provided in the boundary region BA and the normal boundary region. The bank 105 can include an inorganic material, such as $SiO_2$. That is, the bank 105 can include an inorganic material, and thus, when the bank 105 is provided in the boundary groove 103a, the bank 105 can be provided along a shape of the undercut structure.

To provide an additional description, as described above with reference to FIG. 12C, the bank 105 can be formed of an inorganic material, such as $SiO_2$, to prevent the undercut structure from being planarized by the bank 105.

In this situation, as illustrated in part (a) of FIG. 12D, the opening region OA can be formed in the boundary region BA, and as illustrated in part (b) of FIG. 12D, the insulation layer 109 can be completely covered by the bank 105.

Figure 12E:
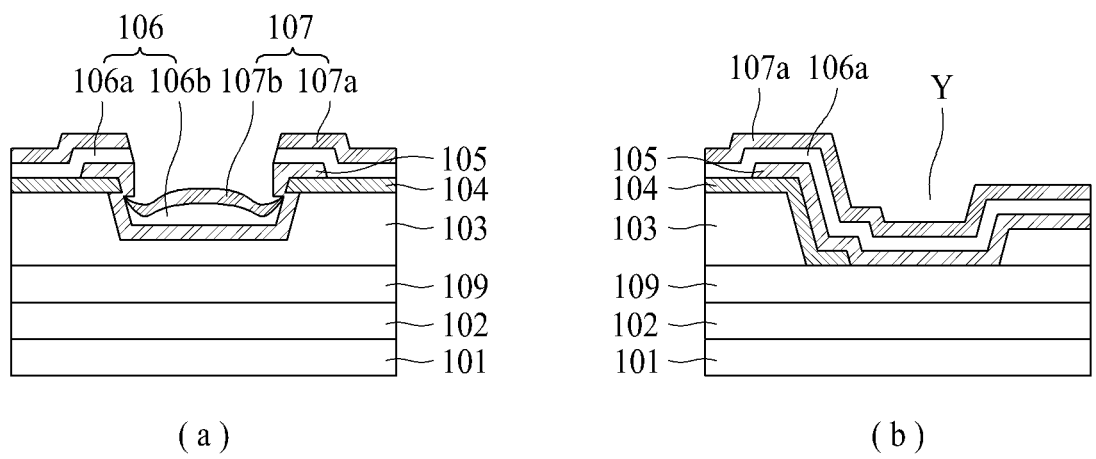

Finally, as illustrated in FIG. 12E, parts (a) and (b), the light emitting layer 120 can be provided on the whole surface of the display area 120.

In this situation, as illustrated in part (a) of FIG. 12E, the boundary region light emitting layer 106b and the main light emitting layer 106a can be separated from each other in the boundary region BA based on a height difference of the boundary groove 103a and an undercut structure of the boundary groove 103a. Particularly, a charge generating layer (CGL) configuring the light emitting layer 106 can be separated by an undercut structure under the anode 104, and thus, the boundary region light emitting layer 106b and the main light emitting layer 106a can be formed.

Moreover, the cathode 107 can be provided on the whole surface of the display area 120. In this situation, the cathode 107 can be divided into the boundary region cathode 107b and the main cathode 107a based on the height difference of the boundary groove 103a and the undercut structure of the boundary groove 103a.

That is, as illustrated in FIG. 12E part (b), the main cathode 107a can be continuously formed in the connection hole Y provided between adjacent pixels, and as illustrated in part (a) of FIG. 12E, the cathode 107 can be divided into the boundary region cathode 107b and the main cathode 107a in the boundary region BA.

According to the present disclosure, the boundary groove 103a can be formed in upper and lower regions between pixels as well as left and right regions between pixels corresponding to a main path for potential lateral leakage current and leakage light, and the boundary region light emitting layer 106b, the main light emitting layer 106a, the boundary region cathode 107b, and the main cathode 107a can be formed by the boundary groove 103a. Accordingly, a lateral leakage current and leakage light can be blocked by the boundary region light emitting layer 106b, the main light emitting layer 106a, the boundary region cathode 107b, and the main cathode 107a which are separated from one another through the boundary groove 103a.

Moreover, the bank 105, the main light emitting layer 106a, and the main cathode 107a can be continuously provided in adjacent pixels in a region, where the connection hole Y is formed, of the planarization layer 103. Accordingly, the main cathode 107a can cover all pixels and can be applied to all pixels in common.

In the above description, a light emitting display panel where the connection hole Y is provided in only an upper portion of a pixel has been described as an example of the present disclosure, but the connection hole Y can be provided in only a lower portion of a pixel or can be provided in all of a lower portion and an upper portion of a pixel.

The features of the light emitting display panels described above with reference to FIGS. 5, 6, 11A, 11B, and 12A to 12E will be briefly described below. First, the boundary region cathode 107b can be provided at a portion, except a connection portion, of a boundary region provided in a pixel connected to the n$^{th}$ gate line GLn included in the substrate 101, and the connection portion can be formed in at least one of a region facing the n−1$^{th}$ gate line GLn−1 and a region facing the n+1$^{th}$ gate line GLn+1.

Subsequently, the light emitting layer 106 can include the boundary region light emitting layer 106b provided in the boundary groove 103a and the main light emitting layer 106a provided at a portion, other than the boundary groove 103a, of the display area 120, and the boundary region light emitting layer 106b and the main light emitting layer 106a can be apart from each other at the boundary groove 103a.

Subsequently, an insulation layer can be further provided between the pixel driving circuit layer and the planarization layer and can be exposed through the connection hole Y which is formed in the planarization layer, in the connection portion. The bank can cover the insulation layer exposed at the connection hole Y, and the main light emitting layer 106a and the main cathode 107a can be provided on the bank provided in the connection hole Y. The main light emitting layer 106a and the main cathode 107a provided in the connection hole Y can be connected to the boundary region light emitting layer 106b and the boundary region cathode 107b provided outside the connection hole Y.

Finally, a height H1 of a region, where the anode 104 is provided, of the planarization layer 103 where the connection hole Y is provided can be greater than a height H2 of a region where the anode 104 is not provided.

According to the embodiments of the present disclosure, an LLC between adjacent pixels can decrease, and thus, light leakage occurring in adjacent pixels can be prevented.

Particularly, according to the embodiments of the present disclosure, a charge generating layer (CGL) of a light emitting layer which is a main path for the lateral leakage current can be apart from a boundary groove between pixels, and thus, comparing with the related art, the LLC can be reduced and a low grayscale color omission phenomenon can decrease.

Moreover, according to the embodiments of the present disclosure, an optically mixed color can be improved by an undercut structure formed at a boundary groove, and the degree of freedom in developing a high resolution and high color reproduction rate model can increase.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light emitting display panel comprising:
a substrate including a non-display area and a display area where a plurality of pixels are provided;
a pixel driving circuit layer disposed on the substrate, the pixel driving circuit layer including a driving transistor;
a planarization layer covering the pixel driving circuit layer;
a plurality of anodes provided on the planarization layer, each of the plurality of anodes configuring a pixel among the plurality of pixels;
a bank disposed between the anodes and including a plurality of opening regions at which the plurality of anodes are exposed;
a light emitting layer disposed on the plurality of anodes and the bank; and
a cathode disposed on the light emitting layer and in the whole display area of the substrate,
wherein a boundary region is provided at an outer portion of each of the plurality of anodes,
wherein the cathode comprises a boundary region cathode and a main cathode,
wherein the boundary region cathode is disposed in a boundary groove in the boundary region between adjacent anodes among the plurality of anodes,
wherein the main cathode is disposed in the display area, and the main cathode is not disposed in the boundary groove,
wherein the boundary region cathode and the main cathode are spaced apart from each other in the boundary groove, and
wherein the bank is disposed in the boundary groove, and the boundary groove is in the planarization layer.

2. The light emitting display panel of claim 1, wherein the boundary region cathode is disposed in a direction parallel to an n$^{th}$ gate line provided in the substrate, wherein n is a natural number greater than 0 and less than or equal to g, where g is a number of gate lines in the substrate.

3. The light emitting display panel of claim 2, wherein the boundary groove is provided in each of regions facing towards anodes included in pixels connected to the n$^{th}$ gate line, and
wherein the boundary region cathode is provided in the boundary groove, wherein n is a natural number greater than 0 and less than or equal to g which is number of gate lines.

4. The light emitting display panel of claim 3, wherein a connection portion is provided at each of portions adjacent to an n−1$^{th}$ gate line or an n+1$^{th}$ gate line, and
wherein the boundary region cathode and the main cathode are connected to each other at the connection portion.

5. The light emitting display panel of claim 1, wherein the light emitting layer comprises:
a boundary region light emitting layer disposed in the boundary groove; and
a main light emitting layer provided at a portion of the display area, the main light emitting layer being absent from the boundary groove, and
wherein the boundary region light emitting layer and the main light emitting layer are spaced apart from each other in the boundary groove.

6. The light emitting display panel of claim 1, wherein:
a height of the planarization layer in the boundary region is less than a height of the planarization layer in a region outside of the boundary region,
a boundary region light emitting layer is disposed on the bank provided in the boundary groove, and
the boundary region cathode is disposed on the boundary region light emitting layer in the boundary groove.

7. The light emitting display panel of claim 6, wherein the light emitting layer comprises:

the boundary region light emitting layer provided in the boundary groove; and
a main light emitting layer disposed in a region of the display area, the main light emitting layer being absent from the boundary groove, and
wherein the boundary region light emitting layer and the main light emitting layer are spaced apart from each other in the boundary groove.

8. The light emitting display panel of claim 6, wherein an end of each of the plurality of anodes protrudes in a direction toward a corresponding boundary groove.

9. The light emitting display panel of claim 1, wherein the boundary region cathode and the main cathode are connected to each other at a connection portion.

10. The light emitting display panel of claim 1, wherein the boundary region cathode is disposed between anodes included in pixels connected to an $n^{th}$ gate line, wherein n is a natural number greater than 0 and less than or equal to g, where g is a number of gate lines in the substrate.

11. The light emitting display panel of claim 10, wherein the boundary region cathode is not provided at portions adjacent to an $n-1^{th}$ gate line and an $n+1^{th}$ gate line, of boundary regions provided in the pixels connected to the $n^{th}$ gate line.

12. The light emitting display panel of claim 4, wherein the light emitting layer comprises:
a boundary region light emitting layer disposed in the boundary groove; and
a main light emitting layer disposed at a portion of the display area, the main light emitting layer being absent from the boundary groove,
wherein the boundary region light emitting layer and the main light emitting layer spaced are apart from each other in the boundary groove, and
wherein the boundary region light emitting layer and the main light emitting layer are connected to each other at the connection portion.

13. The light emitting display panel of claim 1, further comprising:
a contact hole connecting a corresponding anode to the driving transistor at a connection portion in the boundary region,
wherein the boundary groove is not included in the contact hole,
wherein the boundary region cathode and the main cathode are spaced apart from each other in the boundary groove, and
wherein the boundary region cathode and the main cathode are connected to each other at the connection portion.

14. The light emitting display panel of claim 13, wherein the light emitting layer comprises:
a boundary region light emitting layer disposed in the boundary groove; and
a main light emitting layer provided at a portion of the display area, the main light emitting layer being absent from the boundary groove, and
wherein the boundary region light emitting layer and the main light emitting layer are spaced apart from each other in the boundary groove.

15. The light emitting display panel of claim 14, further comprising:
an insulation layer disposed between the pixel driving circuit layer and the planarization layer; and
a first electrode connected to a first terminal of the driving transistor, the first electrode being disposed on an upper surface of the pixel driving circuit layer that is exposed through the contact hole, the contact hole passing through the insulation layer and the planarization layer,
wherein the first electrode is connected to a corresponding anode,
wherein the bank is disposed on the corresponding anode and the first electrode,
wherein the main light emitting layer and the main cathode are disposed on the bank in the contact hole, and
wherein the main light emitting layer and the main cathode are connected to the boundary region light emitting layer and the boundary region, respectively.

16. The light emitting display panel of claim 15, wherein a height of a region of the planarization layer on one side of the connection hole where a corresponding anode is disposed is greater than a height of another region of the planarization layer on another side of the connection hole where the corresponding anode is not disposed.

17. The light emitting display panel of claim 1, wherein the boundary region cathode is disposed at a portion of a boundary region in a pixel connected to an $n^{th}$ gate line among gate lines in the light emitting display panel,
wherein a connection portion is disposed in at least one of a region facing an $n-1^{th}$ gate line among the gate lines and a region facing an $n+1^{th}$ gate line among the gate lines,
wherein n is a natural number greater than 0 and less than or equal to g, g being equal to a number of the gate lines, and
wherein the boundary region cathode is absent from the connection portion.

18. The light emitting display panel of claim 17, wherein the light emitting layer comprises:
a boundary region light emitting layer disposed in the boundary groove; and
a main light emitting layer disposed in a region of the display area, the main light emitting layer being absent from the boundary groove, and
wherein the boundary region light emitting layer and the main light emitting layer are spaced apart from each other in the boundary groove.

19. A light emitting display panel comprising:
a substrate including a non-display area and a display area where a plurality of pixels are provided;
a pixel driving circuit layer disposed on the substrate, the pixel driving circuit layer including a driving transistor;
a planarization layer covering the pixel driving circuit layer;
a plurality of anodes provided on the planarization layer, each of the plurality of anodes configuring a pixel among the plurality of pixels;
a bank disposed between the anodes and including a plurality of opening regions at which the plurality of anodes are exposed;
a light emitting layer disposed on the plurality of anodes and the bank; and
a cathode disposed on the light emitting layer and in the whole display area of the substrate,
wherein a boundary region is provided at an outer portion of each of the plurality of anodes,
wherein the cathode comprises a boundary region cathode and a main cathode,
wherein the boundary region cathode is disposed in a boundary groove in the boundary region between adjacent anodes among the plurality of anodes, wherein the main cathode is disposed in the display area, and the main cathode is not disposed in the boundary groove, wherein the boundary region cathode and the main cathode are spaced apart from each other in the boundary groove, wherein the boundary region cathode is disposed at a portion of a boundary region in a pixel connected to an $n^{th}$ gate line among gate lines in the light emitting display panel, wherein a connection portion is disposed in at least one of a region facing an $n-1^{th}$ gate line among the gate lines and a region facing an n+1th gate line among the gate lines, wherein n is a natural number greater than 0 and less than or equal to g, g being equal to a number of the gate lines, wherein the boundary region cathode is absent from the connection portion, wherein the light emitting layer comprises:

a boundary region light emitting layer disposed in the boundary groove; and a main light emitting layer disposed in a region of the display area, the main light emitting layer being absent from the boundary groove, wherein the boundary region light emitting layer and the main light emitting layer are spaced apart from each other in the boundary groove, wherein an insulation layer is disposed between the pixel driving circuit layer and the planarization layer, wherein the insulation layer is exposed through a connection hole in the planarization layer, at the connection portion, wherein the bank covers the insulation layer exposed at the connection hole, wherein the main light emitting layer and the main cathode are disposed on the bank in the contact hole, and wherein the main light emitting layer and the main cathode are connected to the boundary region light emitting layer and the boundary region cathode, respectively.

20. A display panel comprising:

a first pixel and a second pixel disposed adjacent to each other on a planarization layer;

an anode disposed in each of the first and second pixels;

a bank disposed on an edge of the anode of the first pixel and on an edge of the anode of the second pixel;

a light emitting layer disposed in each of the first and second pixels;

a main cathode disposed in each of the first and second pixels;

a boundary groove in the planarization layer in an area between the first and second pixels;

a boundary region cathode disposed in the boundary groove, wherein the bank is disposed in the boundary groove, wherein the boundary region cathode and the main cathode are spaced apart from each other in the boundary groove, and wherein the boundary region cathode and the main cathode are electrically connected to each other in a region outside of the boundary groove.

* * * * *